(12) United States Patent
Kawachi et al.

(10) Patent No.: US 7,157,847 B2
(45) Date of Patent: Jan. 2, 2007

(54) DISPLAY DEVICE

(75) Inventors: Genshiro Kawachi, Chiba (JP);
Toshihiro Sato, Mobara (JP);
Shigeyuki Nishitani, Mobara (JP);
Naoki Tokuda, Mobara (JP)

(73) Assignee: Hitachi, Ltd., Tokyo (JP)

( * ) Notice: Subject to any disclaimer, the term of this patent is extended or adjusted under 35 U.S.C. 154(b) by 519 days.

(21) Appl. No.: 10/304,700

(22) Filed: Nov. 27, 2002

(65) Prior Publication Data

US 2003/0155612 A1    Aug. 21, 2003

(30) Foreign Application Priority Data

Nov. 29, 2001    (JP)    ............................. 2001-363915

(51) Int. Cl.
*H01J 1/62*    (2006.01)
(52) U.S. Cl. ................... 313/495; 313/498; 313/500
(58) Field of Classification Search ................ 313/495, 313/498, 500
See application file for complete search history.

(56) References Cited

U.S. PATENT DOCUMENTS

| | | | |
|---|---|---|---|
| 6,229,506 B1 | 5/2001 | Dawson et al. | ............... 345/82 |
| 2004/0070331 A1* | 4/2004 | Kuno et al. | ................. 313/495 |

FOREIGN PATENT DOCUMENTS

| | | |
|---|---|---|
| JP | 08-129359 | 5/1996 |
| JP | 11-073158 | 3/1999 |
| JP | 11-219133 | 8/1999 |
| JP | 2000-163014 | 6/2000 |
| JP | 2000-221903 | 8/2000 |
| JP | 2000-330527 | 11/2000 |

* cited by examiner

*Primary Examiner*—David Vu
(74) *Attorney, Agent, or Firm*—Antonelli, Terry, Stout and Kraus, LLP.

(57) ABSTRACT

A self-luminescence display device, in which dispersion in display among a plurality of pixels, caused by dispersion in characteristics among drive thin-film transistors, is decreased and uniform display free of unevenness can be obtained. The device includes a plurality of pixels having current drive type luminescent elements, and parallel-connected n ($n \geq 2$) thin-film transistors to feed a drive current to the respective current drive type luminescent elements. The transistors are arranged in different pixels, respectively, for example, in a first region of pixels adjacent to one another along a first direction. A second region of dummy pixels can be provided on at least one side of said first region along said first direction.

7 Claims, 20 Drawing Sheets

Laser Scan Direction

Laser Scan Direction

FIG.15
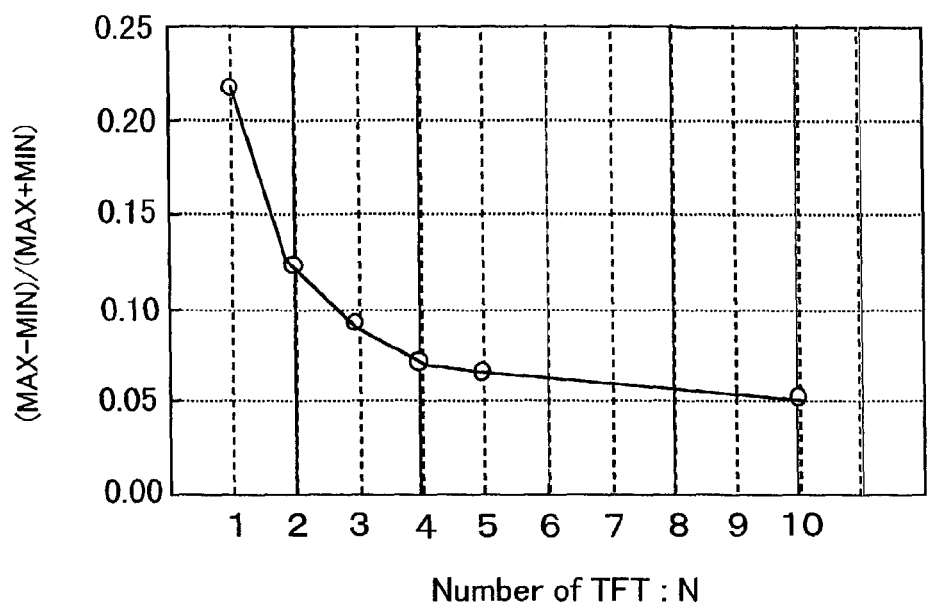
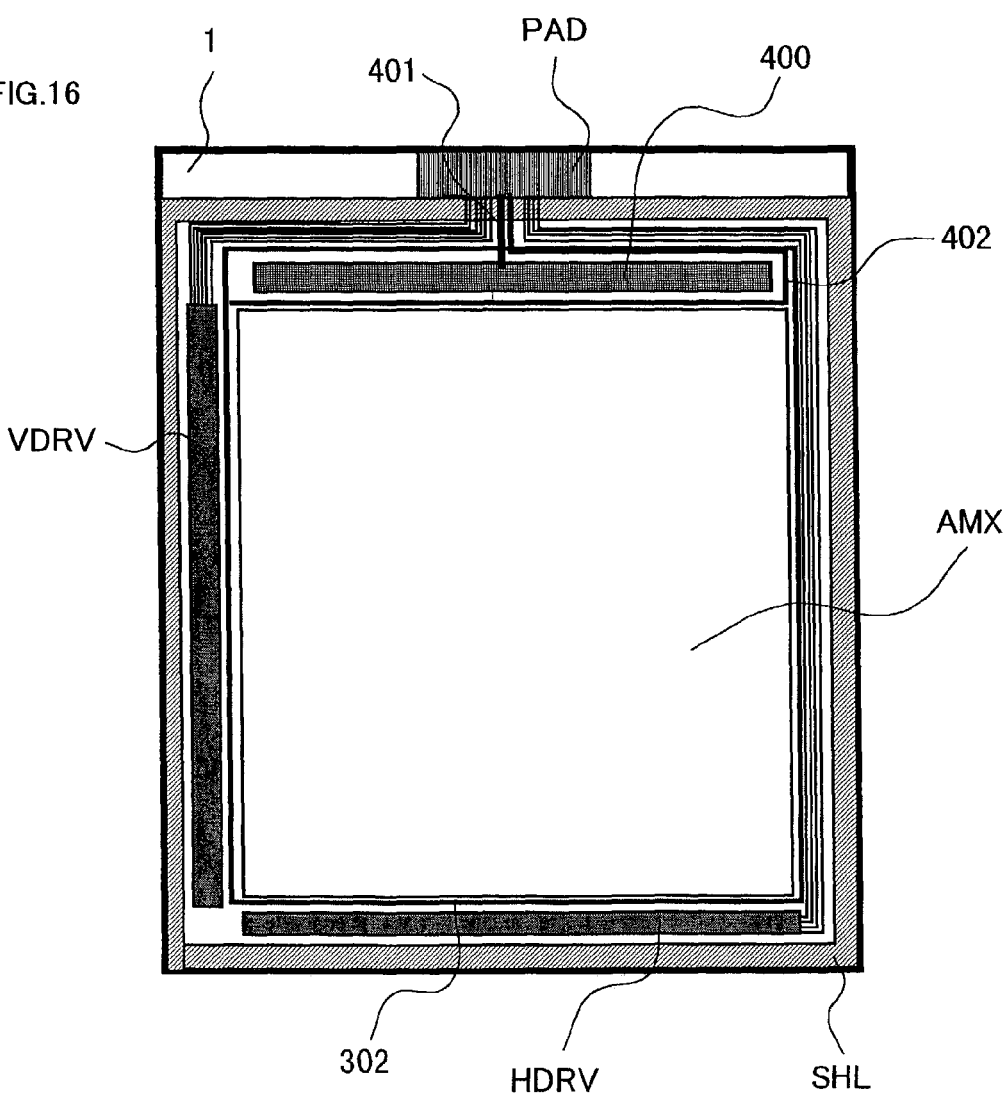
FIG.16

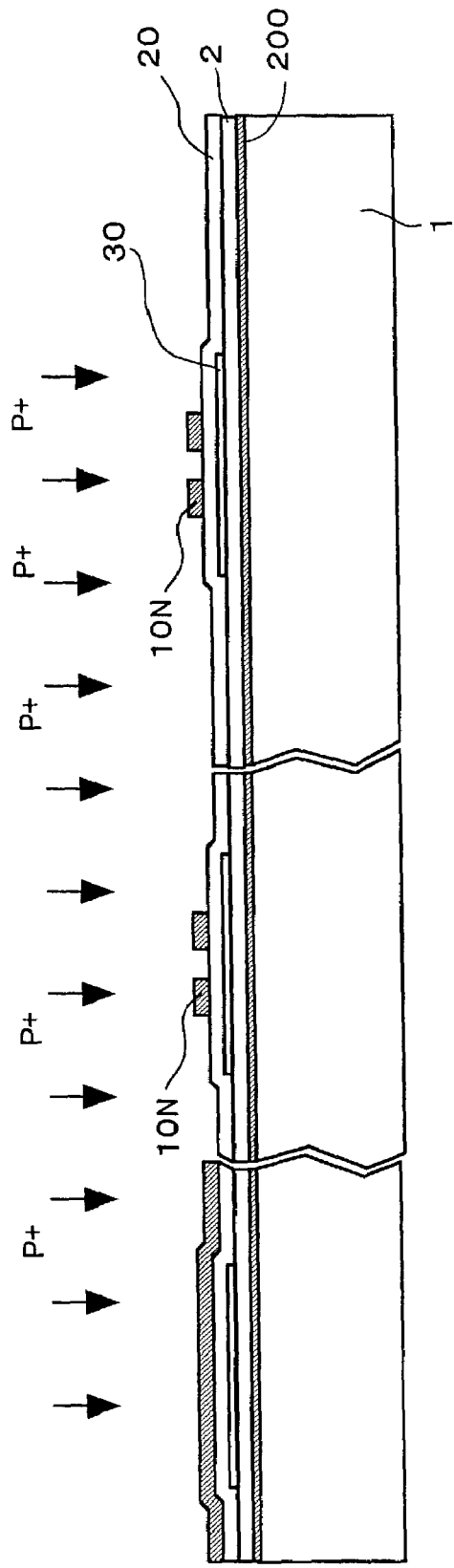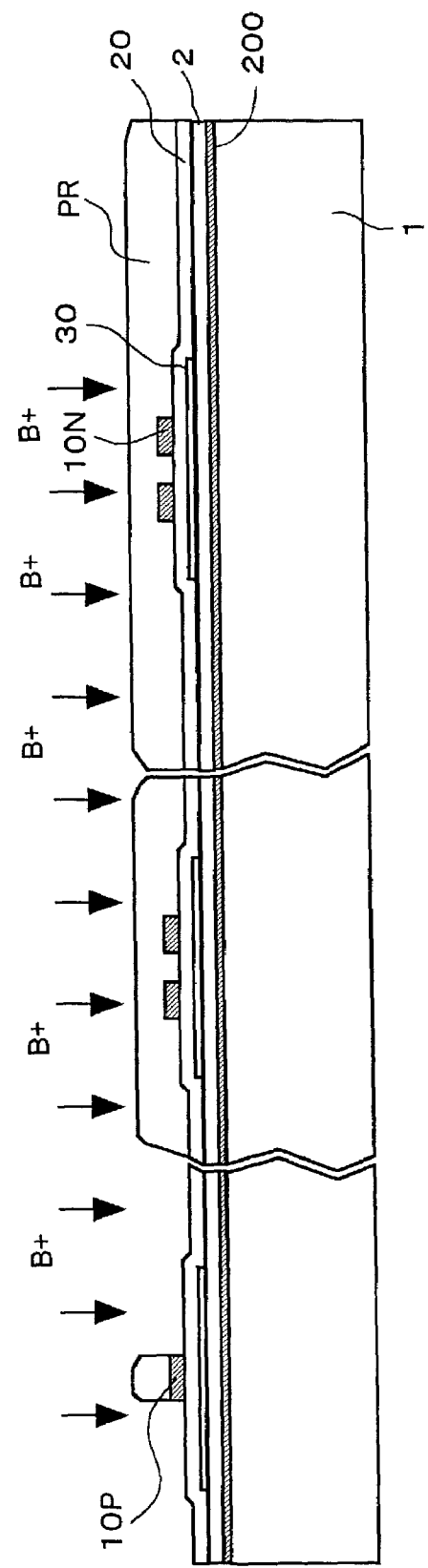

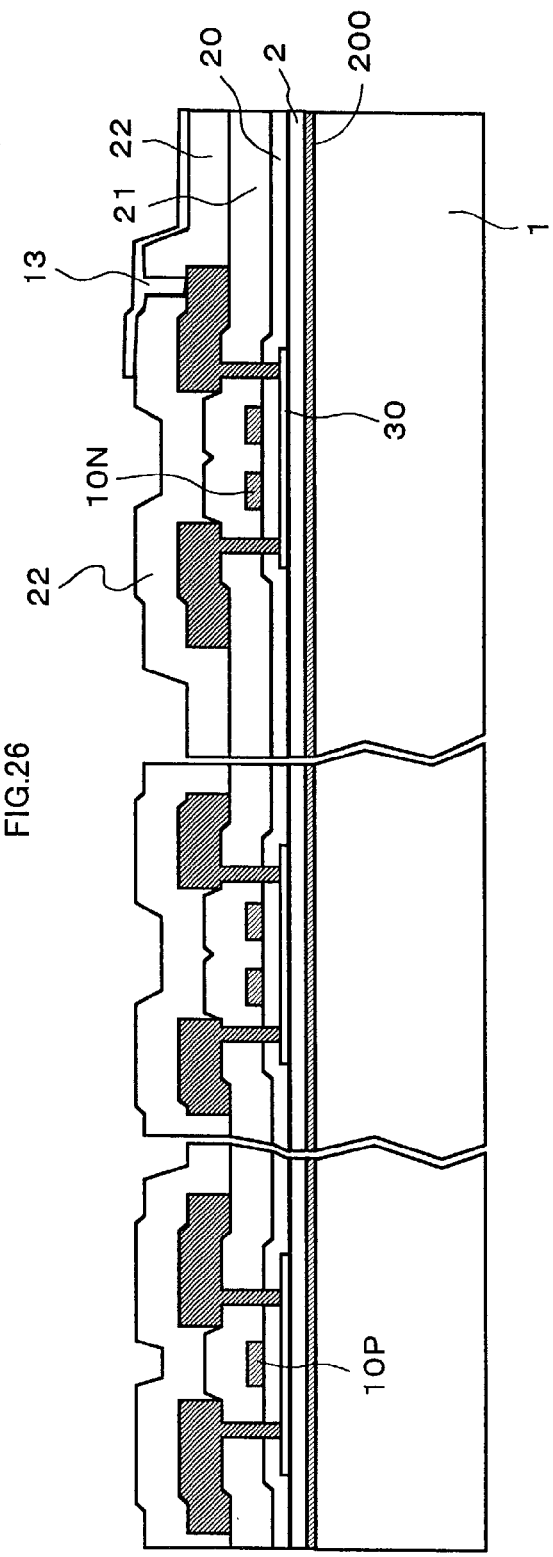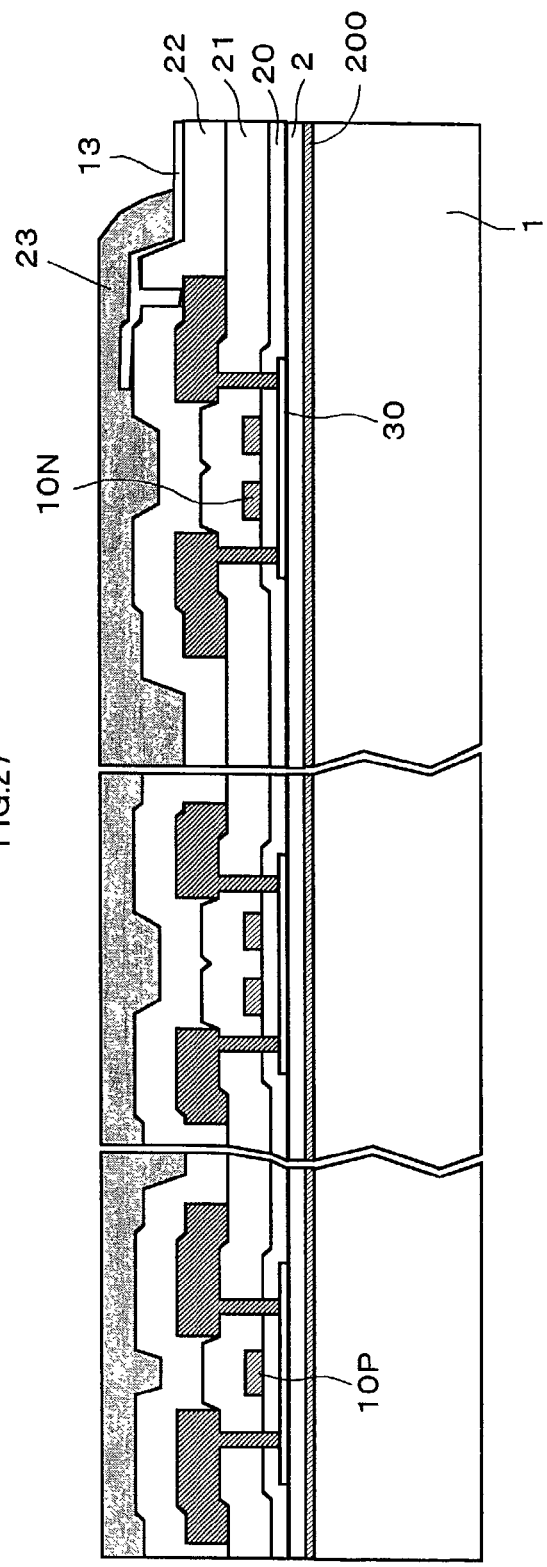

DISPLAY DEVICE

BACKGROUND OF THE INVENTION

1. Field of the Invention

The present invention relates to a display device and, more particularly, to a structure of an active matrix type organic electroluminescent display.

2. Description of the Related Art

Active matrix driven organic electroluminescent displays (referred below to as AMOLED) is expected as flat panel displays of the next generation succeeding conventional liquid crystal displays.

Conventionally, a two-transistor structured circuit, as disclosed in JP-A-2000-163014 (first prior technique), comprising a drive thin-film transistor (referred below to as EL drive TFT) for feeding current to organic electroluminescent elements (referred below simply to as EL element), a holding capacitor connected to a gate electrode of the EL drive TFT for holding a picture signal voltage, and a switch thin-film transistor (referred below to as switch TFT) for feeding a picture signal voltage to the holding capacitor, has been known as a fundamental pixel circuit for a pixel drive circuit of AMOLED.

The two-transistor structured fundamental pixel circuit causes a significant problem that nonuniformity in a picture is caused by dispersion every pixel in a threshold voltage (Vth) and mobility ($\mu$) of the EL drive TFT due to dispersion every location in the crystallizing property of a semiconductor thin film (for which a polycrystal silicon film is ordinarily used) constituting the EL drive TFT.

Since dispersion in threshold voltage and mobility results in dispersion in a drive current value of the EL element, emission intensity disperses to cause minute unevenness to be seen in representation.

Such unevenness in representation becomes particularly problematic when a drive current value is small to represent half tone.

Several measures have been devised in order to suppress that nonuniformity in representation, which is caused by such dispersion in the characteristics of an EL drive TFT.

For example, JP-A-11-219133 discloses a method, in which dispersion in a drive current value is suppressed by making channel length and channel width of an EL drive TFT fairly greater than an average crystal particle size of polycrystal silicon constituting the EL drive TFT (referred below to as second prior technique).

Also, JP-A-2000-3305027 discloses a drive method by a so-called pulse-width modulation, in which an EL drive TFT is driven as a binary switch for effecting a complete OFF state or a complete ON state and tone of a picture is represented by changing a duration of emission (referred below to as third prior technique).

Also, JP-A-11-73158 discloses an area tone system, in which a plurality of EL elements having different luminescent areas are provided in a unit pixel, and an EL drive TFT is connected to each of the plurality of EL elements and driven as a binary switch for effecting a complete OFF state or a complete ON state, whereby tone is represented by changing luminescent areas (referred below to as fourth prior technique).

Also, U.S. Pat. No. 6,229,506B1 discloses a method, in which four TFTs are provided in a pixel to constitute a circuit for cancelling dispersion in a threshold voltage of an EL drive TFT whereby dispersion in drive current is decreased (referred below to as fifth prior technique).

Also, JP-A-8-129359 discloses a method, in which a plurality of EL drive TFTs having different current drive capacities conformed to a plurality of tone currents are connected in parallel to one EL element within each pixel and driven as binary switches for effecting a complete OFF state or a complete ON state, whereby tone representation is controlled by tone currents supplied from the plurality of EL drive TFTs (referred below to as sixth prior technique).

Also, JP-A-2000-221903 discloses a method, in which two EL drive TFTs are provided in a pixel to decrease dispersion in threshold voltages in the EL drive TFTs, thereby reducing dispersion in drive current (referred below to as seventh prior technique).

However, the prior techniques described above involve the following problems.

The second prior technique is directed to averaging dispersion every location in the crystallizing property of the polycrystal silicon by increasing TFT size.

However, even when TFT size is increased, it cannot be made greater than pixel pitch.

Accordingly, since a size of an EL drive TFT for driving an EL element, which constitutes each pixel, is limited within an area of a pixel, and the crystallizing property of a polycrystal silicon film disperses every location, it is not possible to compensate for dispersion between the characteristics of an EL drive TFT in a particular pixel and the characteristics of an EL drive TFT in a pixel adjacent the particular pixel.

It is to be noted that what can be averaged by increasing a TFT size is only dispersion in crystals sized within the TFT size.

Accordingly, it is difficult in the second prior technique to obtain a fairly uniform property of representation.

For the effect of averaging picture representation with the third prior technique, the pulse-width modulation driving is one of valid methods as an AMOLED driving method as having already been proved.

However, known as an essential problem in this driving method is bleeding in a picture generated when animation called pseudo-profile is represented because tone representation is made by luminescence pulse, which is developed on time base.

Also, because of a need for processing a short signal pulse conformed to digital tone, there is caused a problem that the drive circuit is increased in operation frequency and power consumption.

Also, there is also caused a problem that a vertical scanning circuit, which may ordinarily be a simple circuit, becomes complex and a circuit area is increased.

The fourth prior technique is much effective in uniformizing picture representation, but multitone is difficult since it is necessary to form in a unit pixel EL elements having areas conformed to digital tone and to form EL drive TFTs corresponding to the respective EL elements.

Also, it has been known that EL elements are ordinarily decreased in luminescent areas together with operation duration.

In the case of using EL elements having different luminescent areas, deterioration is caused with time beginning with an EL element, which has a small area corresponding to a low-tone bit, thus causing also a problem that normal tone becomes difficult with time.

With the fifth prior technique, the provision of a circuit for canceling dispersion in threshold voltage of an EL drive TFT necessitates a wiring, which is not necessary in a conventional two-transistor configuration, so that a decrease in numerical aperture and yield in manufacture causes a problem.

Also, what can be cancelled is only dispersion in threshold voltage, and dispersion in mobility remains intact. Therefore, there is caused a problem that no fairly uniformizing effect is obtained on drive current.

With the sixth prior technique, a plurality of EL drive TFTs having current drive capacities conformed to digital tone are connected in parallel.

However, it is apparent that normal tone representation is made difficult when the plurality of EL drive TFTs disperse in characteristics.

Also, since the plurality of EL drive TFTs are formed in a single pixel in this method, the technique is in no way effective in decreasing dispersion in representation among a plurality of pixels.

With the seventh prior technique, dispersion in drive current can be decreased in the case where one of two EL drive TFTs connected in parallel is varied in characteristics, but dispersion in drive current cannot be decreased in the case where both the two EL drive TFTs are varied in characteristics, and besides the two EL drive TFTs are formed in a single pixel, so that the technique is in no way effective in decreasing dispersion in representation among a plurality of pixels.

SUMMARY OF THE INVENTION

The invention has been thought of in order to solve the problems of the above prior art, and has its object to provide a technique for display devices, in which dispersion in representation among a plurality of pixels, attributable to dispersion in characteristics of drive thin-film transistors is decreased and uniform representation free of unevenness can be obtained.

Also, another object of the invention is to provide a technique capable of decreasing voltage drop and power consumption caused by resistance of taken-out wirings of cathode electrodes in a display device.

The above and other objects and novel features of the invention will be made apparent from the descriptions in the specification of this application and the accompanying drawings.

An outline of a typical one of the inventions disclosed in this application will be simply described below.

That is, the invention has a feature in that a plurality of EL drive TFTs are connected in parallel to current drive type luminescent elements arranged in respective pixel regions, current is supplied to the current drive type luminescent elements from a plurality of current supply sources, and the plurality of EL drive TFTs are arranged in a plurality of pixel regions at intervals corresponding substantially to pitch of pixel.

The plurality of EL drive TFTs are connected in parallel whereby it is possible to average dispersion in drive current, attributable to dispersion in threshold voltage and mobility among the plurality of EL drive TFTs.

However, only making EL drive TFTs in plural and in parallel does not assure averaging dispersion in drive current for an EL drive TFT corresponding to a particular pixel and, for example, pixels adjacent to the particular pixel.

Nonuniformity in representation is caused by dispersion in drive current for EL drive TFTs in a plurality of pixels, which dispersion is attributable to dispersion in the crystallizing property of a semiconductor film constituting TFTs and spatial dispersion in filmy nature of an insulating film.

Since EL drive TFTs are arranged regularly at the same intervals as array pitch of pixels, it may be thought that dispersion in drive current is attributable to dispersion in the crystallizing property of a semiconductor film and spatial dispersion in filmy nature of an insulating film on a scale of array pitch of pixels.

In order to average such dispersion, it is effective to spatially disperse and arrange the plurality of EL drive TFTs at array pitch of pixels.

Accordingly, a plurality of EL drive TFTs are connected in parallel to current drive type luminescent elements arranged in respective pixel regions, current is supplied to the current drive type luminescent elements from a plurality of current supply sources, and the plurality of EL drive TFTs are arranged in a plurality of pixel regions at intervals corresponding substantially to pitch of pixel, whereby dispersion in drive current supplied to the current drive type luminescent elements corresponding to respective pixels can be decreased and representation can be averaged.

The more the averaging effect by means of the plurality of EL drive TFTs distributed and arranged spatially, the more the number of TFTs connected in parallel.

It is theoretically predicted that the magnitude of dispersion in drive current decreases inversely proportional to $\sqrt{N}$ with an increase in N when the number in parallel is N. Since pixels are limited in size, N=2 to 12 is a practical value according to the rule of fine processing thin-film transistors (TFT) in the present circumstances.

Also, when the number of TFTs in a pixel is increased, it is difficult to ensure an area for EL elements, which contribute to emission of light.

According to the invention, numerical aperture is enhanced by providing a reflective layer in a manner to cover at least a part of EL drive TFTs and forming current drive type luminescent elements on the reflective layer.

Also, since current from the luminescent elements in all pixels flows through taken-out wirings of cathode electrodes of current drive type luminescent elements arranged in respective pixel regions, it is important to decrease resistance of the taken-out wirings.

According to the invention, voltage drop and power consumption caused by resistance of taken-out wirings are minimized by shortening lengths of the taken-out wirings, which are connected electrically to cathode electrodes of a plurality of current drive type luminescent elements, extending from an external connection terminal to a contact area.

Concrete examples will be shown in the following embodiments.

BRIEF DESCRIPTION OF THE DRAWINGS

FIG. 15 is a graph indicating the relationship between the number N of thin-film transistors for driving parallel organic electroluminescence elements and dispersion in luminance among pixels;

FIG. 16 is a plan view showing an entire configuration of display devices according to the respective embodiments of the invention;

FIG. 22 is a view illustrating the manufacturing process of the display device according to the second embodiment of the invention;

FIG. 23 is a view illustrating the manufacturing process, of the display device according to the second embodiment of the invention;

FIG. 26 is a view illustrating the manufacturing process of the display device according to the second embodiment of the invention; and FIG. 27 is a view illustrating the manufacturing process of the display device according to the second embodiment of the invention.

DESCRIPTION OF THE PREFERRED EMBODIMENTS

Embodiments according to the invention will be described in detail with reference to the drawings.

In addition, the same numerals and letters denote elements having the same functions in all the drawings, which illustrate embodiments, and repeated explanations therefor are omitted.

First Embodiment

Figure 1:
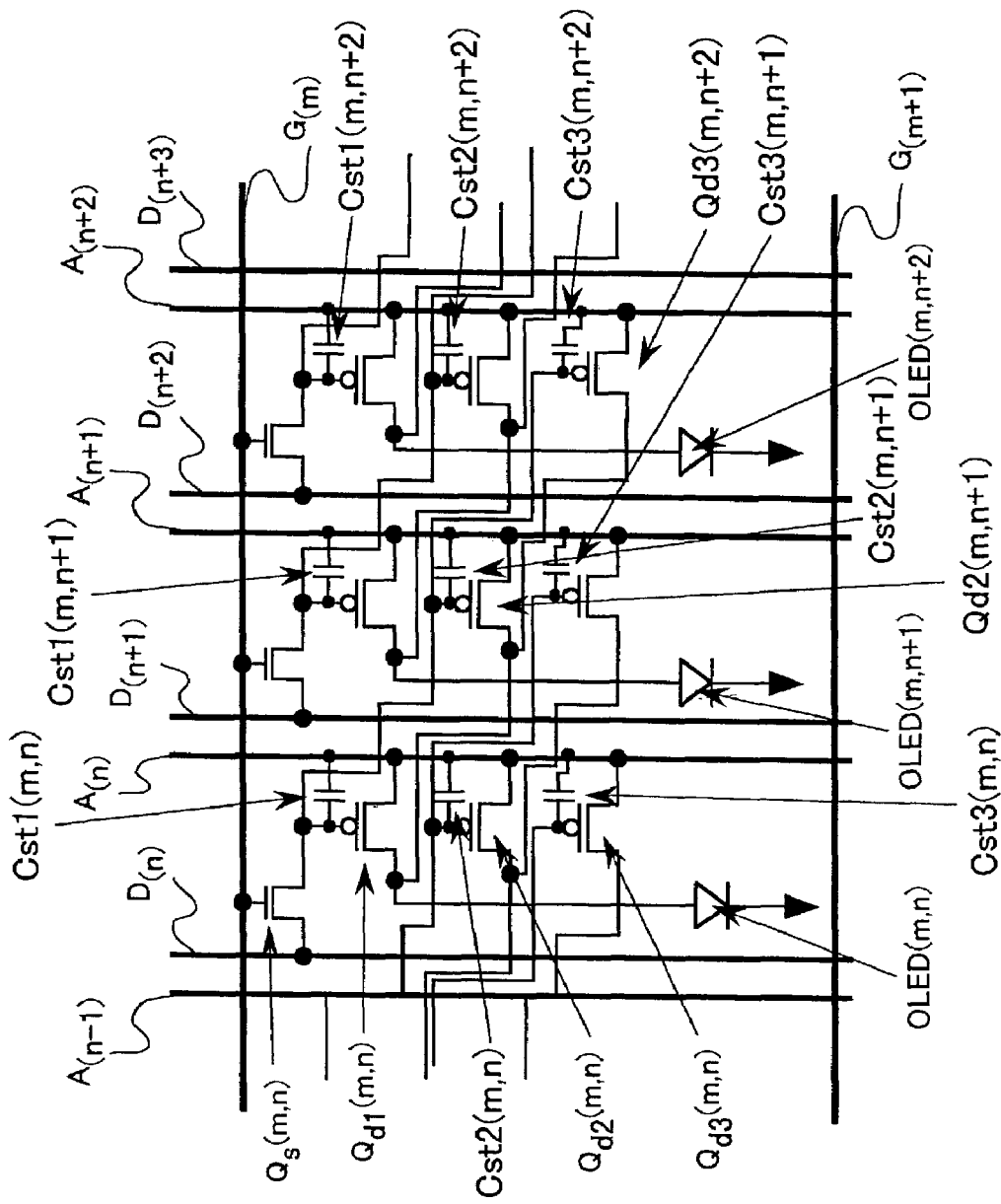
FIG. 1 is a circuit diagram showing equivalent networks for pixels in a display device according to a first embodiment of the invention.
Figure 2:
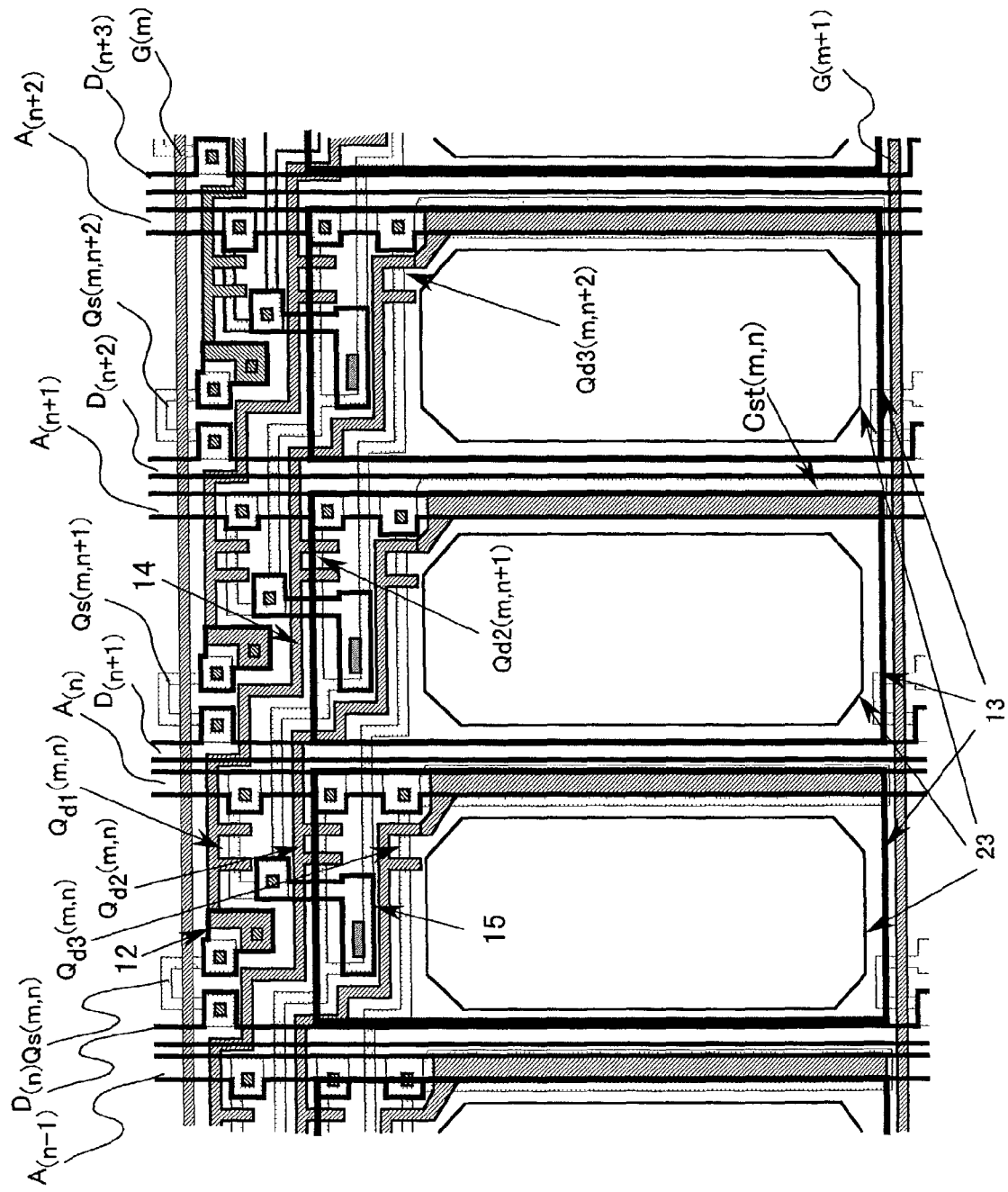
FIG. 2 is a plan view showing a pixel arrangement in the display device according to the first embodiment of the invention.

FIG. 1 is a circuit diagram showing equivalent networks for pixels in a display device according to a first embodiment of the invention, and FIG. 2 is a plan view showing a pixel arrangement in the display device according to the first embodiment of the invention.

In a self-luminescence display device according to the invention, organic electroluminescent elements (referred simply below to as EL elements) of respective pixels are driven by three drive thin-film transistors (referred below to as EL drive TFT) provided on different pixel regions.

In the first embodiment, respective EL drive TFTs are arranged in an associated pixel, the next pixel on the right side and the further next pixel but one on the right side.

In FIG. 1, there are shown three pixel regions surrounded by scanning signal wiring electrodes (Gm, G(m+1)), picture signal wiring electrodes (Dn to D(n+1)), and anode current feeding wiring electrodes (A(n−1) to A(n+2)), which constitute a part of a TFT matrix.

A pixel in a row m and a column n is defined by a region surrounded by scanning signal wiring electrodes (Gm, G(m+1)), a picture signal wiring electrodes Dn, and an anode current feeding wiring electrode An.

Formed in respective pixels are switch thin-film transistors (referred below to as switch TFT) (Qs(m, n)), three EL drive TFTs (Qd1(m, n), Qd2(m, n), Qd3(m, n)), and a charge-storage capacitance Cst(m, n).

An anode electrode of an EL element OLED(m, n) is connected to a drain electrode of the EL drive TFT (Qd1(m, n)) via an EL connection wiring electrode 15.

The EL element OLED(m, n) belonging to a pixel in row m and column n is connected not only to the EL drive TFT (Qd1(m, n)) in the pixel but also in parallel to the EL drive TFT (Qd2(m, n+1)) formed in an adjacent pixel in row m and column (n+1) and the EL drive TFT (Qd3(m, n+2)) formed in an pixel in row m and column (n+2) such that current is fed from three anode current feeding wiring electrodes (An, A(n+1), A(n+2)).

All gate wiring electrodes 14 of the three parallel-connected EL drive TFTs are connected to a drain electrode of a switch TFT (Qs(m,n)) of a pixel in row m and column n via an EL connection wiring electrode 12.

Also, a charge-storage capacitance Cst (m, n+2) is formed between gate electrode nodes of the three EL drive TFTs and the anode current feeding wiring electrode A(n+2) to be able to keep voltage of the gate wiring electrodes 14 for a predetermined period of time.

In the embodiment, scanning signal wiring electrodes G are sequentially scanned, and a switch TFH (Qs), to which a scanning signal wiring electrode G made at H level is connected, is made ON.

Thereby, a picture signal voltage is fed via the switch TFH (Qs) to a charge-storage capacitance Cst from the picture signal wiring electrodes Dn to be held on the charge-storage capacitance Cst.

Based on the picture signal voltage held on the charge-storage capacitance Cst, the respective EL drive TFTs (Qd1, Qd2, Qd3) feed to the EL elements OLED current corresponding to the picture signal voltage held on the charge-storage capacitance Cst during one frame.

Thereby, the EL elements OLED emit light to display a picture image.

In addition, with the embodiment, gate length, channel length, and channel width are set so that current fed to the respective EL drive TFTs (Qd1, Qd2, Qd3) becomes substantially equal to a current fed by a single EL drive TFT.

In the embodiment, the respective EL drive TFTs (Qd1(m,n), Qd2(m,n), Qd3(m,n)) are of a double gate structure to have a gate length of 10 μm, total channel length of 20 μm, and a channel width of 4 μm.

Supplying of current to the EL elements OLED(m,n) from the EL drive TFT (Qd2(m, n+1)) and the EL drive TFT (Qd3(m, n+2)) is made by extending p+type semiconductor layers, which constitute source electrodes and drain electrodes of the respective EL drive TFTs, as they are and using the same as wiring.

With such configuration, since formation of surplus contact through holes is made unnecessary, surface efficiency is enhanced with the result that numerical aperture is improved.

Take again notice of a pixel in row m and column n, the EL drive TFT (Qd2(m,n)) among the three EL drive TFTs (Qd1(m,n), Qd2(m,n), Qd3(m,n)) is provided to drive an EL element OLED(m, n−1) of a pixel in row m and column (n−1), and the EL drive TFT (Qd3(m,n)) is provided to drive an EL element OLED(m, n−2) of a pixel in row m and column (n−2).

Also, the charge-storage capacitance Cst(m, n) is provided to hold an electric potential of a gate electrode node of the EL drive TFT (Qd3(m,n)).

The EL elements are formed on ITO electrodes (anode electrodes of the EL elements) 13, which are connected to the EL connection wiring electrodes 15 via contact through holes, through openings formed on organic insulating films 23.

Figure 3:
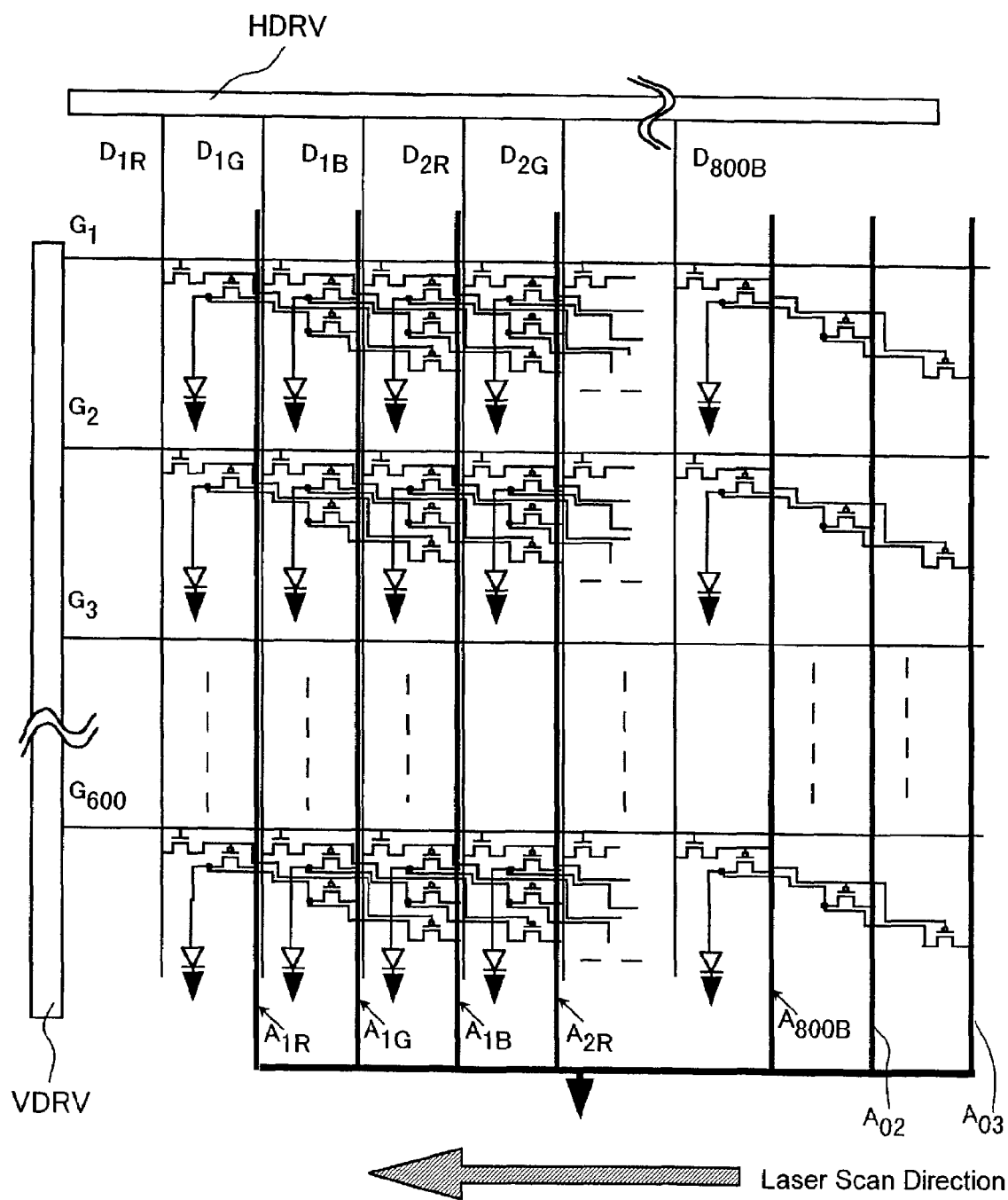
FIG. 3 is a circuit diagram showing an entire display unit including equivalent networks and a driving circuit in a matrix display section of the display device according to the first embodiment of the invention.

FIG. 3 is a circuit diagram showing an entire display unit including equivalent networks and a driving circuit in a matrix display section of the display device according to the first embodiment.

As shown in FIG. 3, the matrix display section is composed of 600 scanning signal wiring electrodes G1 to G600, 2400 picture signal wiring electrodes D1R to D800R, D1G to D800G, and D1B to D800B, 2400 anode current feeding wiring electrodes A1R to A800R, A1G to A800G, and A1B to A800B, and pixels provided in regions where these electrodes intersect.

The matrix display section is driven by a vertical scanning circuit VDRV and a picture signal circuit HDRV, and the anode current feeding wiring electrodes arranged on the respective pixels are short-circuited outside the regions of pixels to be connected to an external electric power source.

In the embodiment, since the EL drive TFTs are arranged in an associated pixel, the next pixel on the right side and the further next pixel, two rows of dummy regions of pixels are provided outside a rightmost row of pixels.

Further, two anode current feeding wiring electrodes (A02, A03) are provided corresponding to the two rows of dummy regions of pixels outside the rightmost row of pixels.

Thus three anode current feeding wiring electrodes can also feed a specified current to the rightmost row of pixels via three EL drive TFTs.

Here, three pixels, in which three EL drive TFTs are arranged as shown in FIG. 3, are ones arranged in the same direction as a laser scanning direction of laser used when EL drive TFTs are manufactured.

In this manner, EL drive TFTs are scattered to be arranged in a plurality of pixels, and connected in parallel to drive one EL element, whereby current for the EL drive TFTs is averaged and so dispersion in drive current between pixels can be reduced to improve uniformity in display.

Also, since three anode current feeding wiring electrodes feed current to one EL element via three EL drive TFTs at the same time, redundancy is provided for deficiency in display, which is caused by breaking of anode current feeding wiring electrodes and failure in opening of EL drive TFTs, thus enabling enhancing yield in manufacture.

Second Embodiment

Figure 4:
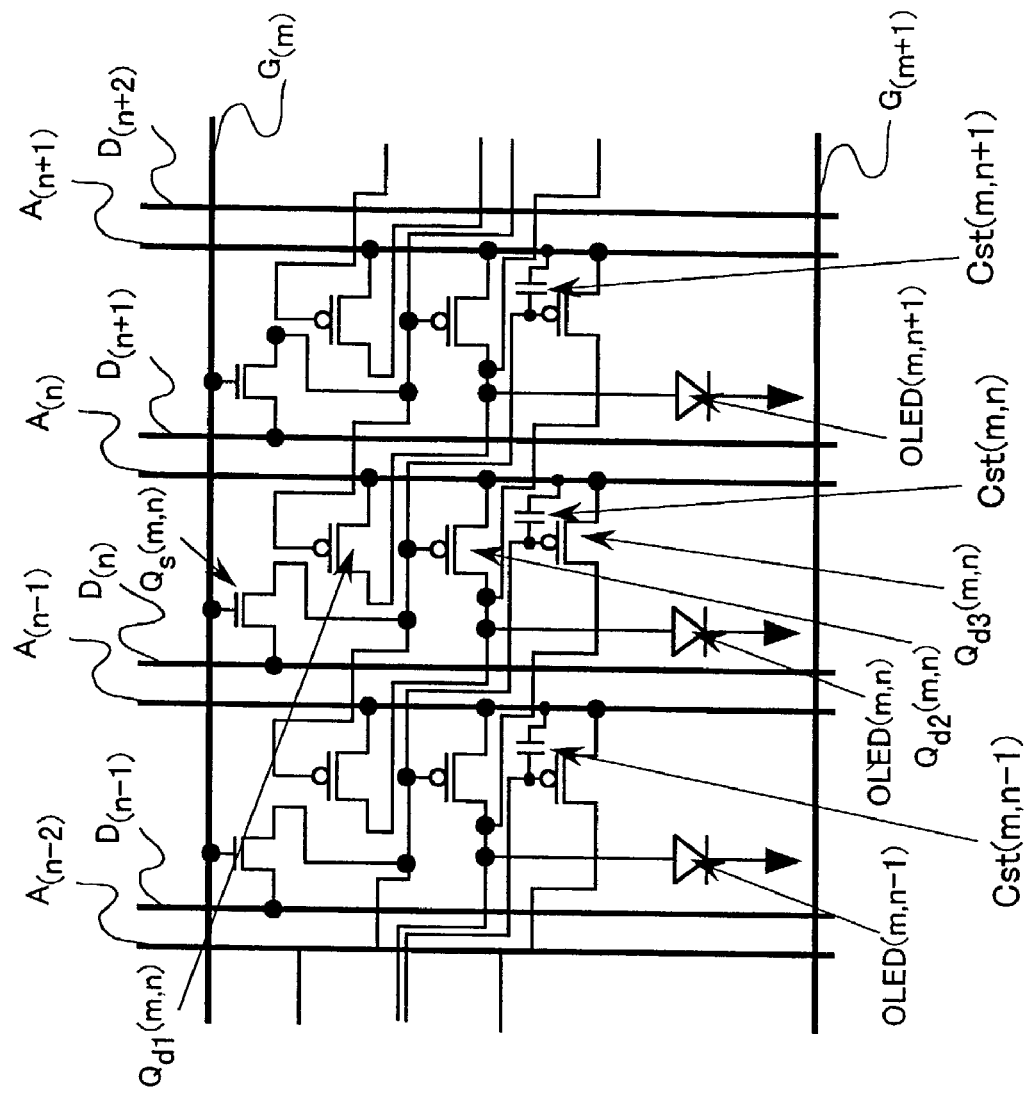
FIG. 4 is a circuit diagram showing equivalent networks for pixels in a display device according to a second embodiment of the invention.
Figure 5:
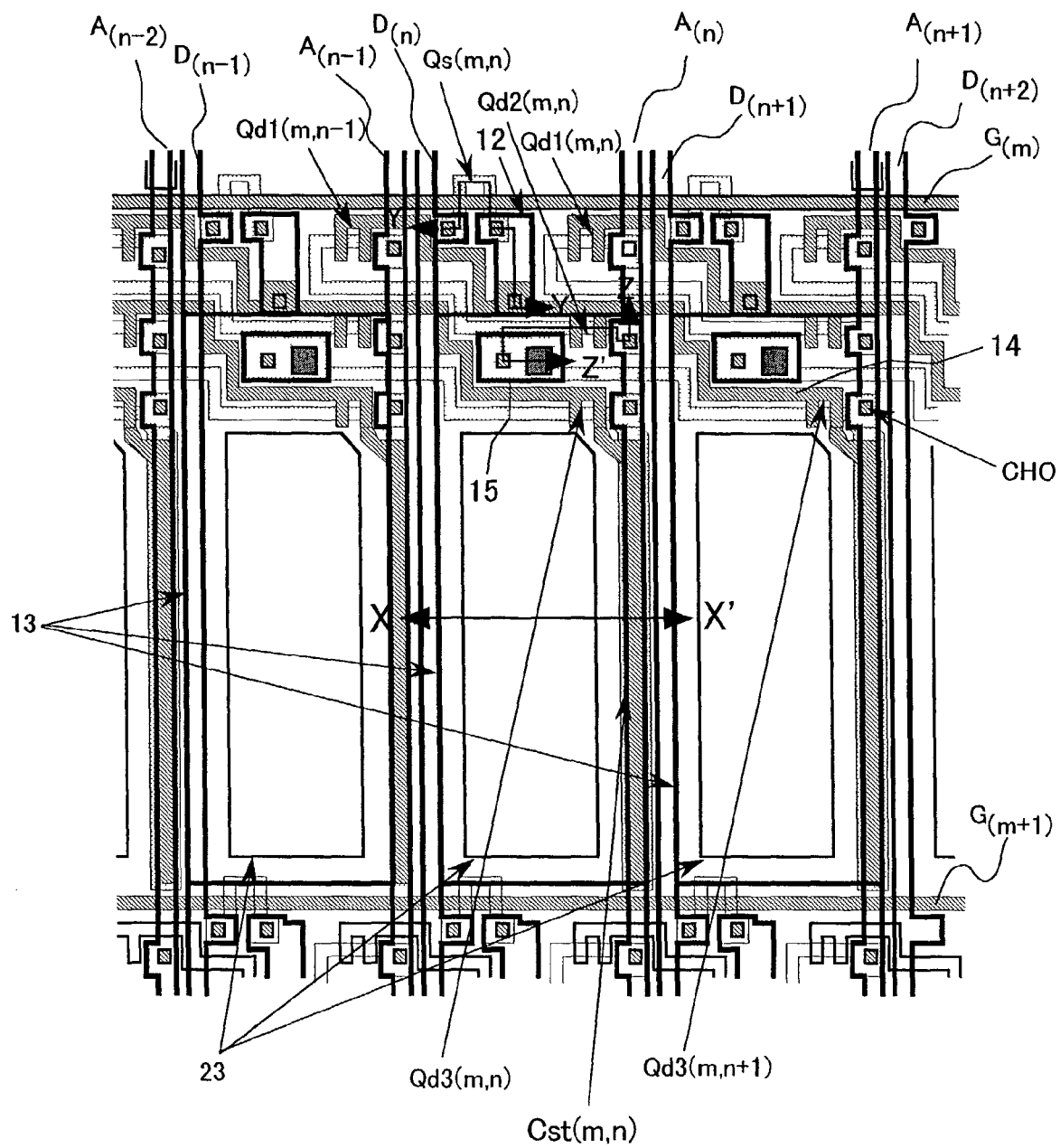
FIG. 5 is a plan view showing a pixel arrangement in the display device according to the second embodiment of the invention.

FIG. 4 is a circuit diagram showing equivalent networks for pixels in a display device according to a second embodiment of the invention, and FIG. 5 is a plan view showing a pixel arrangement in the display device according to the second embodiment of the invention.

As described above, with the self-luminescence display device according to the invention, EL elements of respective pixels are driven by three EL drive TFTs provided on different pixel regions.

In the embodiment, respective EL drive TFTs are arranged in an associated pixel, and the next pixels on the right and left sides.

FIG. 4 shows three regions of pixels surrounded by scanning signal wiring electrodes (Gm, G(m+1)), picture signal wiring electrodes (D(n−1) to D(n+2)), anode current feeding wiring electrodes (A(n−2) to A(n+1)), which constitute a part of the matrix.

A pixel in row m and column n is defined by a region, which is surrounded by scanning signal wiring electrodes (Gm, G(m+1)), a picture signal wiring electrode Dn and an anode current feeding wiring electrode An, and there are formed in the pixel a switch TFT (Qs(m, n)), three EL drive TFTs (Qd1(m,n), Qd2(m,n), Qd3(m,n)), and a charge-storage capacitance Cst(m, n).

An anode electrode of an EL element OLED(m, n) is connected to a drain electrode of the EL drive TFT (Qd2(m, n)) via an EL connection wiring electrode 15.

An EL element OLED(m, n) belonging to a pixel in row m and column n is connected not only to the EL drive TFT (Qd2(m, n)) in the pixel but also in parallel to an EL drive TFT (Qd3(m, n+1)) formed in an adjacent pixel in row m and column (n+1) and an EL drive TFT (Qd1(m, n−1)) formed in an pixel in row m and column (n−1) such that current is fed from three anode current feeding wiring electrodes (A(n−1), An, A(n+1)).

All gate wiring electrodes 14 of the three parallel-connected EL drive TFTs are connected to a drain electrode of a switch TFT (Qs(m,n)) of a pixel in row m and column n via an EL connection wiring electrode 12.

Also, a charge-storage capacitance Cst (m, n+1) is formed between gate electrode nodes of the three EL drive TFTs and the anode current feeding wiring electrode A(n+1) to be able to keep voltage of the gate wiring electrodes 14 for a predetermined period of time.

With the embodiment, gate length, channel length, and channel width are set so that current fed to the respective EL drive TFTs (Qd1, Qd2, Qd3) becomes substantially equal to a current fed by a single EL drive TFT.

In the embodiment, the respective EL drive TFTs (Qd1(m,n), Qd2(m,n), Qd3(m,n)) are of a double gate structure to have a gate length of 10 µm, total channel length of 20 µm, and a channel width of 4 µm.

Supplying of current to the EL elements OLED(m,n) from the EL drive TFT (Qd1(m, n−1)) and the EL drive TFT (Qd3(m, n+1)) is made by extending p+type semiconductor layers, which constitute source electrodes and drain electrodes of the respective EL drive TFTs, as they are and using the same as wiring.

With such configuration, since formation of surplus contact through holes is made unnecessary, surface efficiency is enhanced with the result that numerical aperture is improved.

Taking again notice of a pixel in row m and column n, the EL drive TFT (Qd1(m,n)) among the three EL drive TFTs (Qd1(m,n), Qd2(m,n), Qd3(m,n)) is provided to drive an EL element OLED(m, n+1) of a pixel in row m and column (n+1), and the EL drive TFT (Qd3(m,n)) is provided to drive an EL element OLED(m, n−1) of a pixel in row m and column (n−1).

Also, the charge-storage capacitance Cst(m, n) is provided to hold an electric potential of a gate electrode node of the EL drive TFT (Qd3(m,n)).

The EL elements are formed on ITO electrodes (anode electrodes of the EL elements) 13, which are connected to the EL connection wiring electrodes 15 via contact through holes, through openings formed on an organic insulating film 23.

Figure 6:
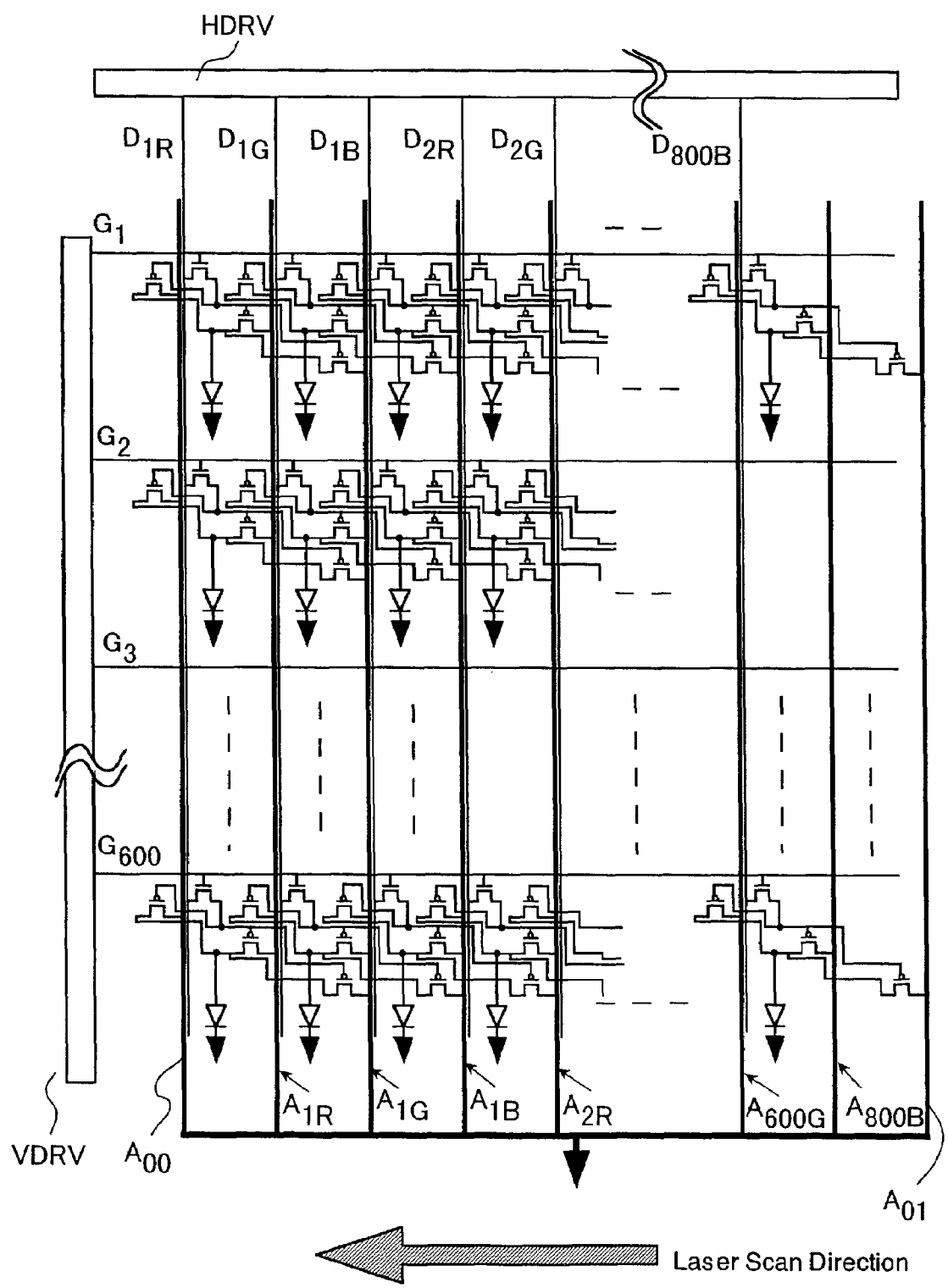
FIG. 6 is a circuit diagram showing an entire display unit including equivalent networks and a driving circuit in a matrix display section of the display device according to the second embodiment of the invention.

FIG. 6 is a circuit diagram of an entire display unit including equivalent networks and a driving circuit in a matrix display section of the display device according to the second embodiment.

As shown in FIG. 6, the matrix display section is composed of 600 scanning signal wiring electrodes G1 to G600, 2400 picture signal wiring electrodes D1R to D800R, D1G to D800G, and D1B to D800B, 2400 anode current feeding wiring electrodes A1R to A800R, A1G to A800G, and A1B to A800B, and pixels provided in regions where these electrodes intersect.

The matrix display section is driven by a vertical scanning circuit VDRV and a picture signal circuit HDRV, and the anode current feeding wiring electrodes arranged on the respective pixels are short-circuited outside the regions of pixels to be connected to an external electric power source.

In the embodiment, since the EL drive TFTs are arranged in an associated pixel, and the next pixels on the right and left sides, two rows of dummy regions of pixels are provided on both sides of leftmost and rightmost rows of pixels, respectively.

Further, two anode current feeding wiring electrodes (A00, A01) are provided corresponding to the dummy pixels formed on the leftmost and rightmost rows of pixels.

Thus three anode current feeding wiring electrodes can also feed a specified current to the leftmost and rightmost row of pixels via three EL drive TFTs.

In this manner, EL drive TFTs are scattered to be arranged in a plurality of pixels, and connected in parallel to drive one EL element, whereby current for the EL drive TFTs is averaged and so dispersion in drive current between pixels can be reduced to improve uniformity in display.

Also, since three anode current feeding wiring electrodes feed current to one EL element via three EL drive TFTs at the same time, redundancy is provided for deficiency in display, which is caused by breaking of anode current feeding wiring electrodes and failure in opening of EL drive TFTs, thus enabling enhancing yield in manufacture.

In the embodiment, the number of EL drive TFTs arranged in parallel is three, and the EL drive TFTs are arranged in an associated pixel, and the next pixels on the right and left sides.

In comparing with the embodiment described above, lengths of the current feeding wiring electrodes constituted by p+type semiconductor layers from the EL drive TFT (Qd1(m,n−1)) and the EL drive TFT (Qd3(m,n+1)) to the EL element OLED(m, n) can be made substantially the same.

Thereby, sums of wiring resistances of the EL drive TFT and the p+type semiconductor layers from the anode current feeding wiring electrode A(n+1) and the anode current feeding wiring electrode A(n+1) to the EL element OLED (m, n) can be made substantially the same.

Since the wiring resistance of the p+type semiconductor layers is ordinarily set to be lower than the ON resistance of the EL drive TFT, unbalance in the wiring resistance of the p+type semiconductor layers causes no significant problem but an error is caused when wiring length is increased.

An error due to unbalance in the wiring resistance of the p+type semiconductor layers can be minimized by arranging EL drive TFTs in the next pixels on both sides as in the embodiment.

Figure 7:
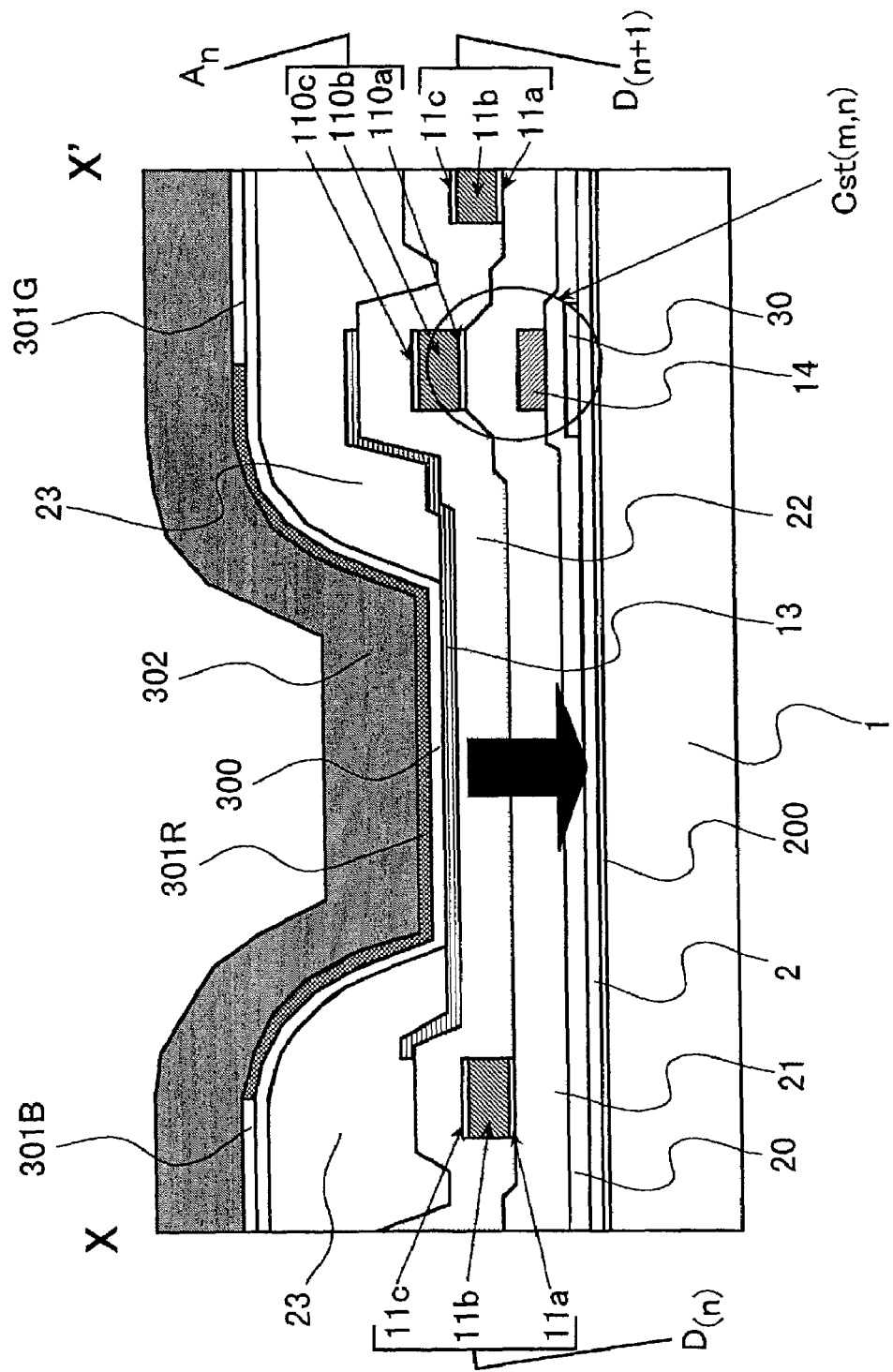
FIG. 7 is a cross sectional view showing a cross-sectional structure cut along the line X–X' shown in FIG. 5.

FIG. 7 is a cross sectional view showing a cross-sectional structure cut along the line X–X' shown in FIG. 5.

As shown in FIG. 7, a buffer $Si_3N_4$ film 200 having a thickness of 50 nm and a buffer $SiO_2$ film 2 having a thickness of 100 nm are formed on a non-alkali glass substrate 1 having a thickness of 0.5 mm and a strain temperature of about 670° C.

These buffer insulating films (200, 2) serve to prevent dispersion of impurities, such as Na or the like, from the glass substrate 1.

Formed on the buffer $SiO_2$ film 2 is a polycrystal Si (referred below to as poly-Si) film 30 having a thickness of 50 nm and corresponding to the charge-storage capacitance Cst (m, n), and formed on the poly-Si film 30 through a gate insulating film 20 formed from $SiO_2$ are gate wiring electrodes 14 of the EL drive TFTs composed of Mo.

Anode current feeding wiring electrodes An are formed on the gate wiring electrodes 14 of the EL drive TFTs through an interlayer insulating film 21 composed of $SiO_2$, and are of a three-layered electrode structure composed of Mo (110a), Al (110b), and Mo (110c).

Here, the gate wiring electrode 14 of the EL drive TFT (Qd3(m, n)) shown in FIG. 7 is shown as its portion being extended below the anode current feeding wiring electrode An such that the gate wiring electrode 14 of the EL drive TFT (Qd3(m, n)) overlaps the anode current feeding wiring electrode An as shown in FIG. 5.

Also, the poly-Si film 30 shown in FIG. 7 is formed to overlap the anode current feeding wiring electrode An as shown in FIG. 5, and the poly-Si film 30 is electrically connected to the anode current feeding wiring electrode An via a contact hole (CHO in FIG. 5).

Accordingly, in the embodiment, the charge-storage capacitance Cst(m, n) is defined by a capacitative element formed by the interlayer insulating film 21 between the anode current feeding wiring electrode An and the gate wiring electrode 14, and a capacitative element formed by a gate insulating film 20 between the gate wiring electrode 14 and the poly-Si film 30.

In this manner, pixels are improved in numerical aperture by forming the charge-storage capacitance Cst(m, n) below the anode current feeding wiring electrode An.

Also, picture signal wiring electrodes (Dn, D(n+1)) are also formed on the same layer as the anode current feeding wiring electrode An, and the picture signal wiring electrodes (Dn, D(n+1)) are of a three-layered electrode structure composed of Mo (11a), Al (11b), and Mo (11c).

All these constituents are covered by a protective insulating film 22 having a film thickness of 200 nm and composed of $Si_3N_4$, on which film is formed an anode electrode 13 composed of an indium-tin oxide (ITO).

Further, an organic insulating film 23 having a film thickness of 2 μm and containing polyimide as its main component is formed on the anode electrode 13, and the organic insulating film 23 is provided substantially centrally of the anode electrode 13 with an opening.

Formed on the anode electrode 13 and the organic insulating film 23 is an electron hole transport layer 300 having a film thickness of 150 nm and composed of triphenyldiamine (TPD), and formed on the layer are a red EL luminescent layer 301R composed of a tris (8-hydroxyquinoline) aluminum (Alq3) having a film thickness of 30 nm and doped with DCJTB and rubrene, and an electron transport layer (not shown) having a film thickness of 30 nm and composed of Alq3.

Formed above the electron transport layer through LiF having a film thickness of 0.8 nm is a cathode electrode 302 having a film thickness of 150 nm.

Electron holes injected from the anode electrode 13 and electrons injected from the cathode electrode 302 make radiational reunion in the red EL luminescent layer 301R to cause emission.

Light generated is emitted toward the glass substrate 1.

Arranged in adjacent pixels are blue dots and green dots, on which a blue EL luminescent layer 301B and a green EL luminescent layer 301G are formed in place of a red EL luminescent layer.

The blue EL luminescent layer 301B is DPVBi doped with BCzVBi having a film thickness of 15 nm, and the green EL luminescent layer 301G is Alq3 doped with coumarin 540 having a film thickness of 30 nm.

Figure 8:
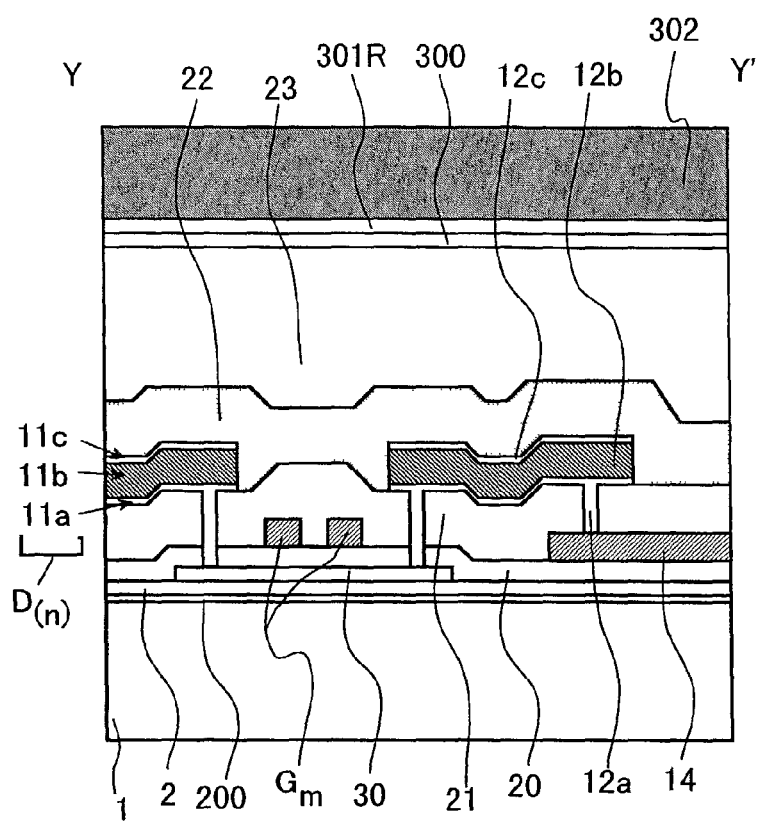
FIG. 8 is a cross sectional view showing a cross-sectional structure cut along the cut line Y–Y' shown in FIG. 5.
Figure 9:
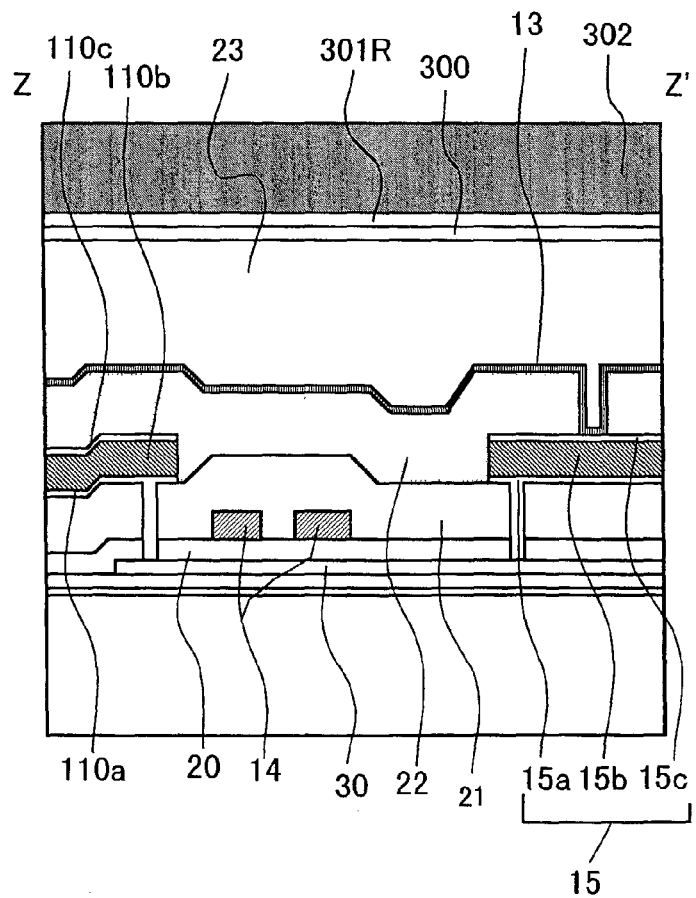
FIG. 9 is a cross sectional view showing a cross-sectional structure cut along the cut line Z–Z' shown in FIG. 5.

FIG. 8 is a cross sectional view showing a cross-sectional structure cut along the cut line Y–Y' shown in FIG. 5, and FIG. 9 is a cross sectional view showing a cross-sectional structure cut along the cut line Z–Z' shown in FIG. 5.

As described above, the buffer $Si_3N_4$ film 200 having a thickness of 50 nm and the buffer $SiO_2$ film 2 having a thickness of 100 nm are formed on the non-alkali glass substrate 1, the poly-Si film 30 having a thickness of 50 nm and corresponding to the switch TFT (Qs(m,n)) and the EL drive TFT (Qd2(m, n)) is formed on the films, and the scanning signal wiring electrodes Gm and the gate wiring electrodes 14 of the EL drive TFTs are formed on the poly-Si film 30 through the gate insulating film 20 formed from $SiO_2$.

Here, the scanning signal wiring electrodes Gm are formed from Mo.

The switch TFT (Qs(m,n)) is composed of a N type TFT, the picture signal wiring electrode Dn is connected to a source electrode of the switch TFT through a contact hole opened to the interlayer insulating film 21, and the connection wiring electrode 12 is connected to a drain electrode of the switch TFT.

As described above, the picture signal wiring electrode Dn is of a three-layered electrode structure composed of Mo (11a), Al (11b), and Mo (11c), and likewise the connection wiring electrodes 12 are of a three-layered electrode structure composed of Mo (12a), Al (12b), and Mo (12c).

The other of the connection wiring electrodes 12 is also connected to the gate wiring electrodes 14 of the EL drive TFTs via through holes formed in the interlayer insulating film 21, so that a signal voltage of the picture signal wiring electrode Dn is applied to the gate wiring electrode 14 of the EL drive TFT via the switch TFT (Qs(m,n)).

Meanwhile, the EL drive TFT (Qd2(m, n)) is composed of a Ptype TFT, to a source electrode of which the anode current feeding wiring electrode An is connected via a contact hole opened to the interlayer insulating film 21.

As described above, the anode current feeding wiring electrode An is of a three-layered electrode structure composed of Mo (110a), Al (110b), and Mo (110c).

A drain electrode of the EL drive TFT (Qd2(m, n)) is made common to drain electrodes of the EL drive TFT (Qd1(m,n–1)) and the EL drive TFT (Qd3(m,n+1)), which are adjacent to the EL drive TFT (Qd2(m, n)), to be connected to the EL connection wiring electrode 15.

Here, the EL connection wiring electrodes 15 are of a three-layered electrode structure composed of Mo (15a), Al (15b), and Mo (15c).

Also, the anode electrodes 13 are connected to the EL connection wiring electrodes 15 via through holes formed in the protective insulating film 22 having a film thickness of 200 nm and composed of $Si_3N_4$.

Organic LEDs having the above layered structure are formed above the anode electrodes 13.

Third Embodiment

Figure 10:
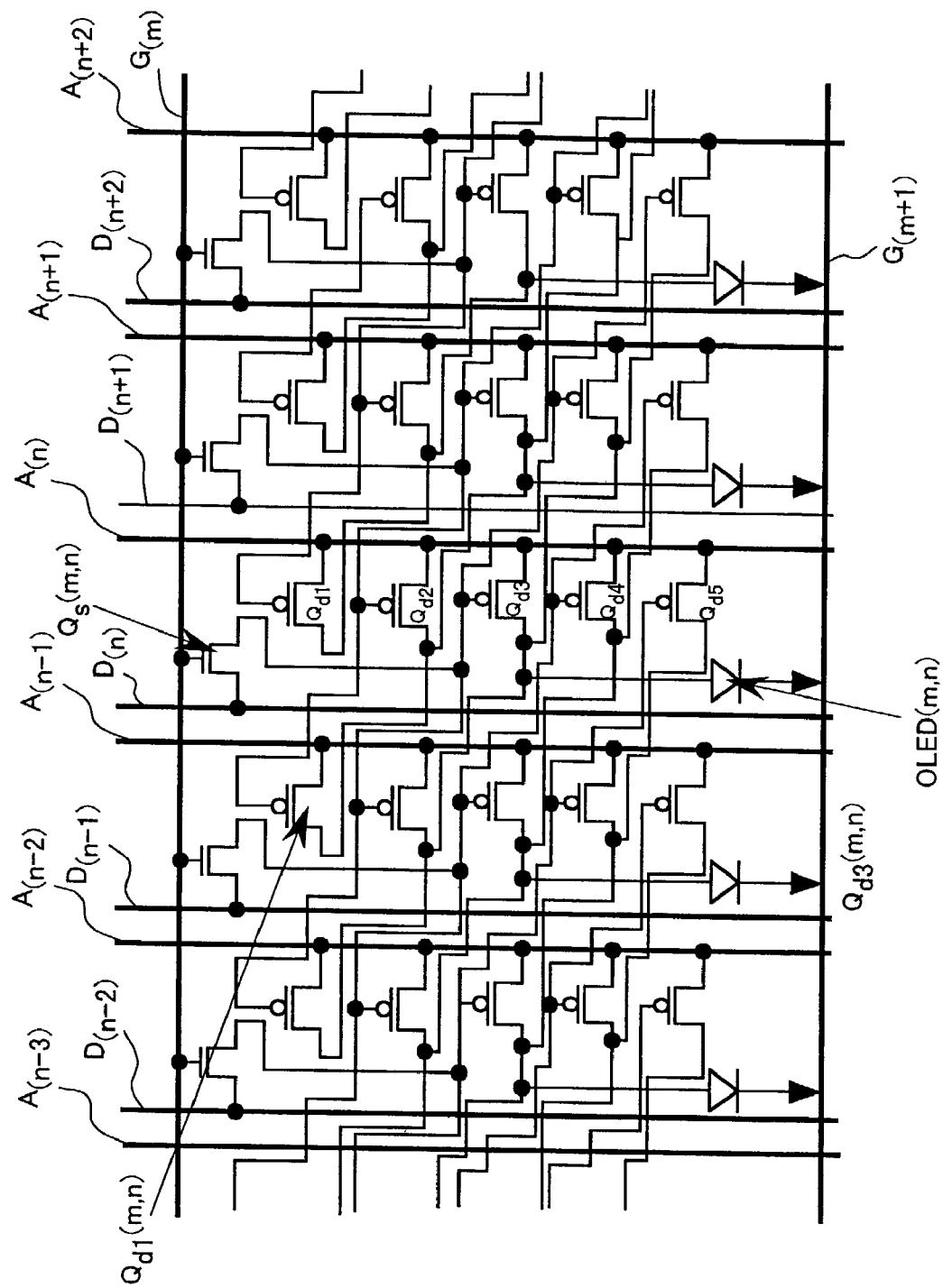
FIG. 10 is a circuit diagram showing equivalent networks for pixels in a display device according to a third embodiment of the invention.
Figure 11:
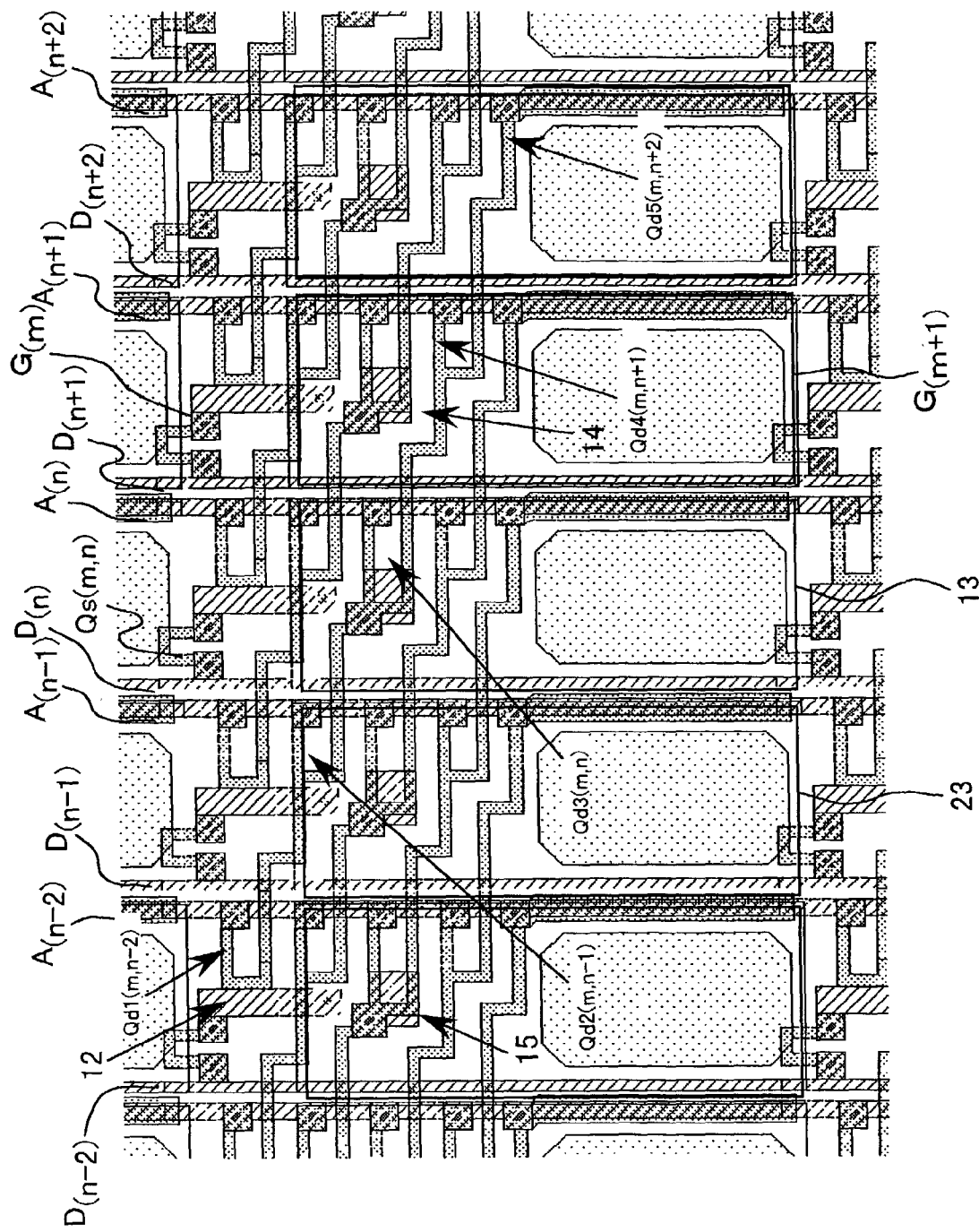
FIG. 11 is a plan view showing a pixel arrangement in the display device according to the third embodiment of the invention.

FIG. 10 is a circuit diagram showing equivalent networks for pixels in a display device according to a third embodiment of the invention, and FIG. 11 is a plan view showing a pixel arrangement in the display device according to the third embodiment of the invention.

With the self-luminescence display device according to the embodiment, an EL element OLED(m, n) in row m and column n is driven by five parallel EL drive TFTs formed in total five regions of pixels in row m and column (n–2), row m and column (n–1), row m and column (n+1), and row m and column (n+2) as well as in row m and column n.

Since the number in parallel is five, such averaging greatly contributes to improvement in uniformity, which makes it possible to obtain an enhanced uniform display characteristics.

Fourth Embodiment

Figure 12:
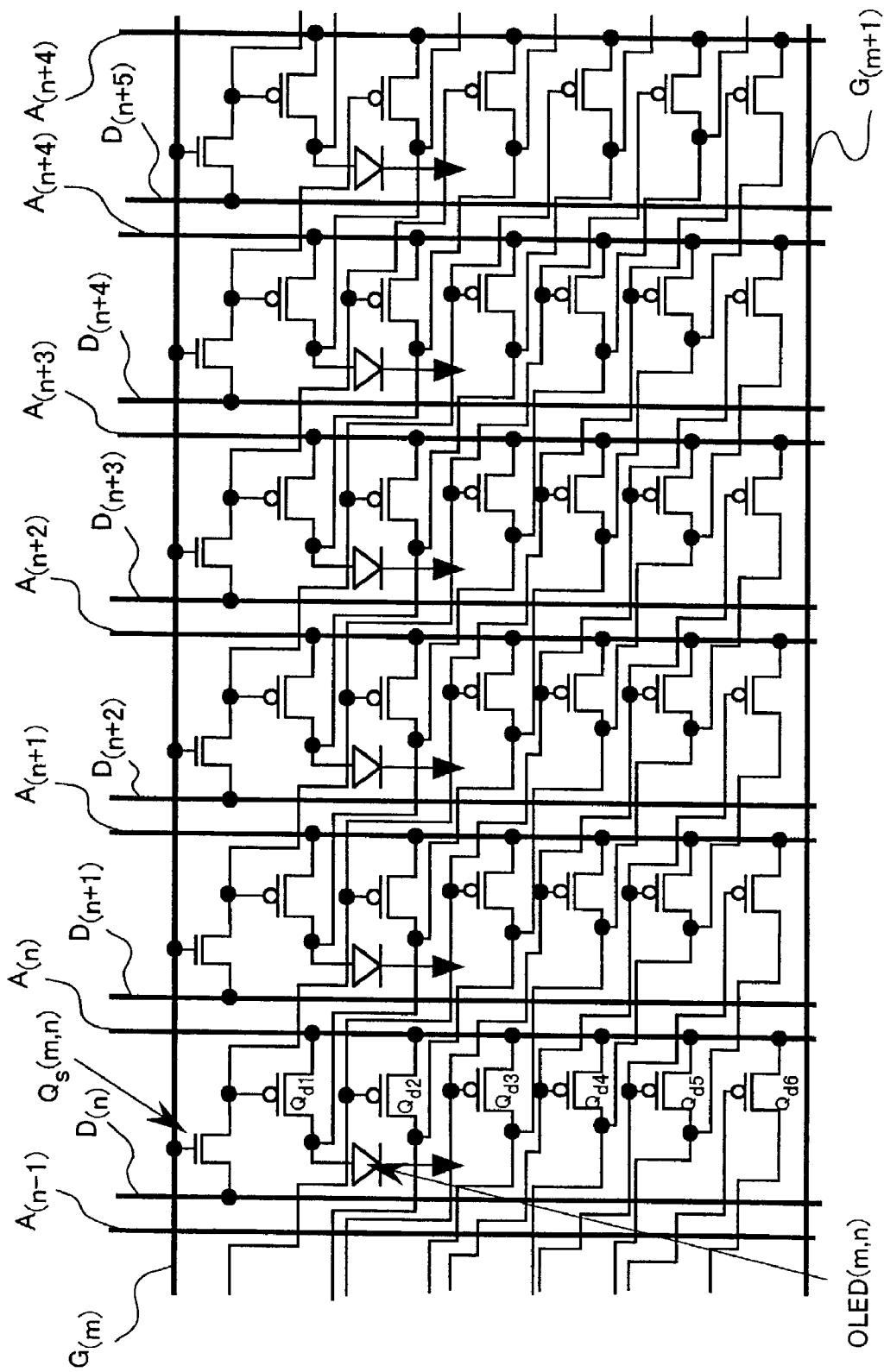
FIG. 12 is a circuit diagram showing equivalent networks for pixels in a display device according to a fourth embodiment of the invention.
Figure 13:
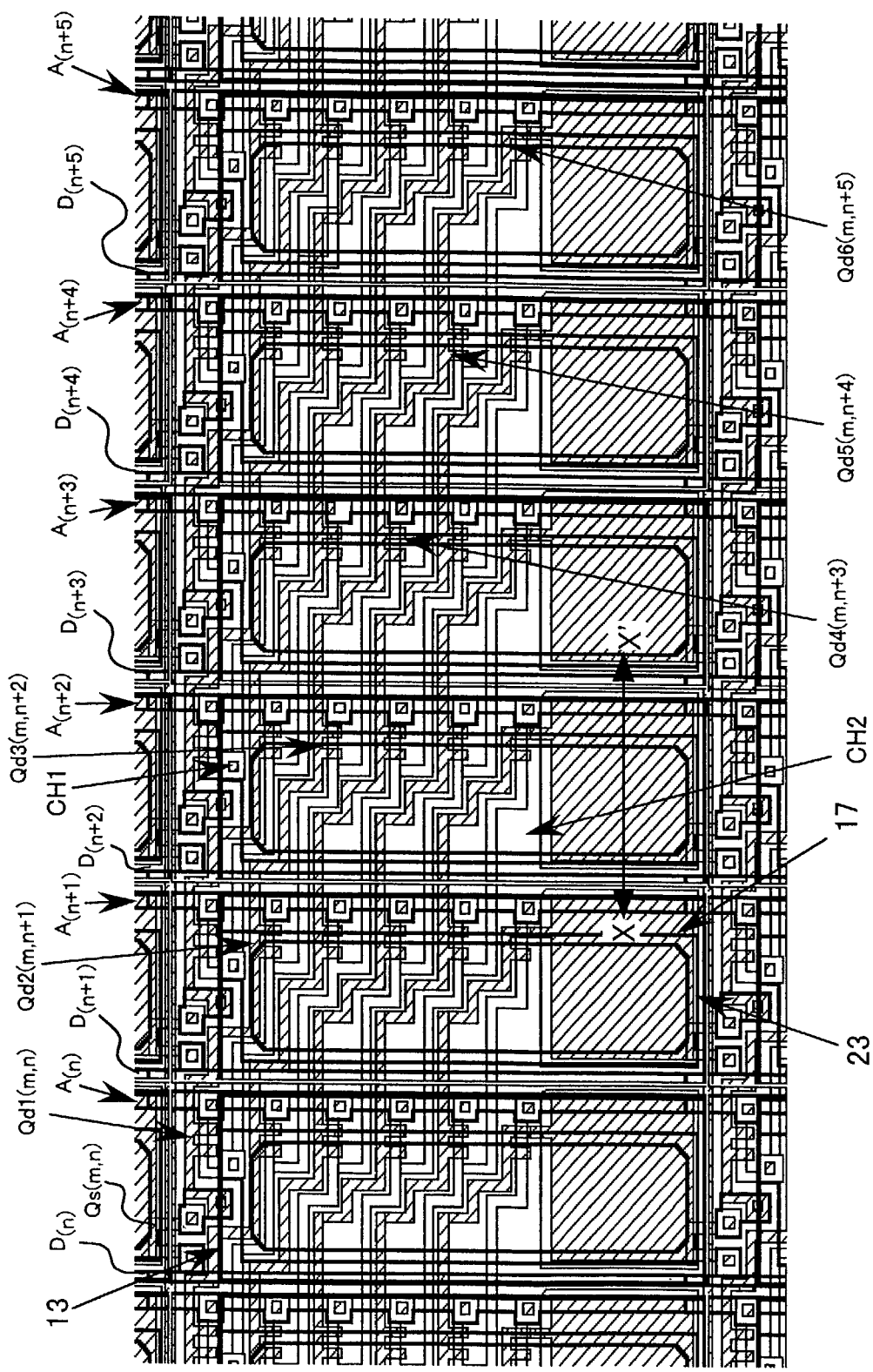
FIG. 13 is a plan view showing a pixel arrangement in the display device according to the fourth embodiment of the invention.

FIG. 12 is a circuit diagram showing equivalent networks for pixels in a display device according to a fourth embodiment of the invention, and FIG. 13 is a plan view showing a pixel arrangement in the display device according to the fourth embodiment of the invention.

With the self-luminescence display device according to the embodiment, an EL element OLED(m, n) in row m and column n is driven by six parallel EL drive TFTs formed in total six regions of pixels in row m and column (n+1), row m and column (n+2), row m and column (n+3), row m and column (n+4), and row m and column (n+5) as well as in row m and column n.

Since the number in parallel is six, such averaging greatly contributes to improvement in uniformity, which makes it possible to obtain an enhanced uniform display characteristics.

Also, the embodiment adopts a configuration, in which light emitted from the EL elements is taken not from a side of the substrate but a side of a front surface.

When the number of TFTs in pixels is increased as in the embodiment, it becomes difficult to ensure an area of those EL elements, which contribute to emission of light.

In such case, that configuration, in which light is taken from the side of a front surface, is advantageous.

Figure 14:
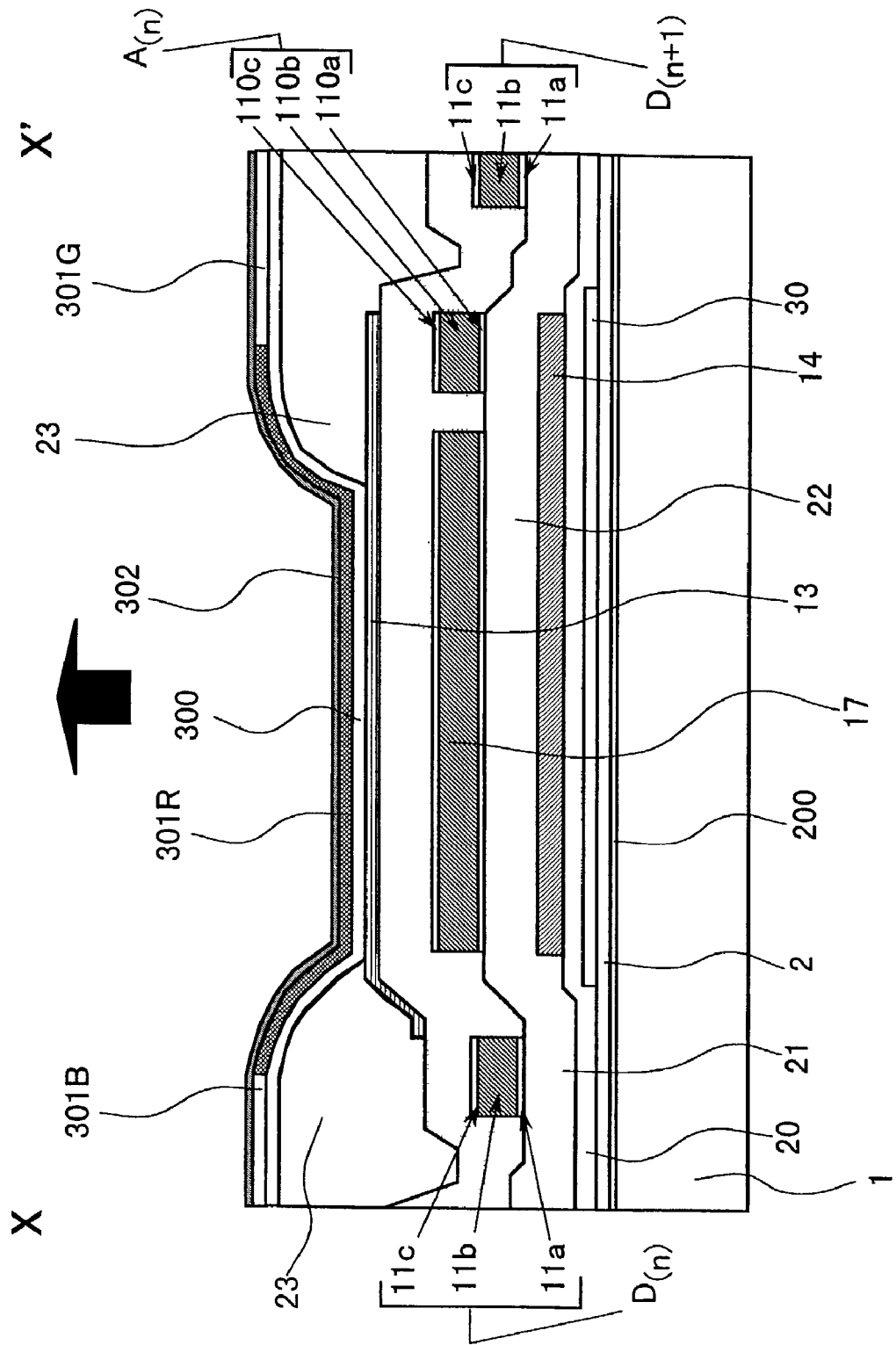
FIG. 14 is a cross sectional view showing a cross-sectional structure cut along the line X–X' shown in FIG. 13.

FIG. 14 is a cross sectional view showing a cross-sectional structure cut along the line X–X' shown in FIG. 13. As shown in FIG. 14, a buffer $Si_3N_4$ film 200 having a thickness of 50 nm and a buffer $SiO_2$ film 2 having a thickness of 100 nm are formed on a non-alkali glass substrate 1 having a thickness of 0.5 mm and a strain temperature of about 670° C.

Formed on the buffer $SiO_2$ film 2 is a polycrystal Si film 30 having a thickness of 50 nm and corresponding to the charge-storage capacitance Cst(m, n), and formed on the poly-Si film 30 through a gate insulating film 20 formed from $SiO_2$ are gate wiring electrodes 14 of the EL drive TFTs composed of Mo.

The gate wiring electrode 14 of the EL drive TFT (Qd3(m, n)) shown in FIG. 14 is shown as its portion being extended below an associated pixel as shown in FIG. 13, and the poly-Si film 30 shown in FIG. 14 is electrically connected to the anode current feeding wiring electrode An through the contact hole as shown in FIG. 13.

The anode current feeding wiring electrode An is formed above the gate wiring electrode 14 of the EL drive TFT with an interlayer insulating film 21 formed from $SiO_2$ therebetween. The anode current feeding wiring electrode An is of a three-layered electrode structure composed of Mo (110a), Al (110b), and Mo (110c).

Also, a picture signal wiring electrode Dn and a reflective film 17 are also formed on the same layer as the anode current feeding wiring electrode An.

The picture signal wiring electrode Dn is of a three-layered electrode structure composed of Mo (11a), Al (11b), and Mo (11c), and the reflective film 17 is also of a three-layered electrode structure composed of Mo/Al/Mo.

The reflective film 17 is connected to an anode electrode 13 via openings (CH1, Cf2 in FIG. 13) formed in a protective insulating film 22 having a film thickness of 200 nm and composed of $Si_3N_4$.

The reflective film 17 is formed in a region in, for example, a pixel in row m and column n, except for that region, in which a switch TFT and an EL drive TFT (Qd1(m,n)) are formed.

The reflective film 17 serves to reflect light emitted from an EL element to a front surface and constitutes a part of the charge-storage capacitance Cst(m, n) between it and the poly-Si film 30 when the EL drive TFT (Qd3(m, n)) is ON.

Accordingly, in the embodiment, the charge-storage capacitance Cst(m, n) is defined by a capacitative element formed by the gate insulating film 20 between the gate wiring electrode 14 and the poly-Si film 30, and a capacitative element formed by an interlayer insulating film 21 between the reflective film 17 and the poly-Si film 30.

All these constituents are covered by a protective insulating film 22 having a film thickness of 200 nm and formed from $Si_3N_4$, on which film is formed an anode electrode 13 composed of an indium-tin oxide (ITO).

Further, an organic insulating film 23 having a film thickness of 2 μm and containing polyimide as its main component is formed on the anode electrode 13, and the organic insulating film 23 is provided substantially centrally of the anode electrode 13 with an opening.

Formed on the anode electrode 13 and the organic insulating film 23 is an electron hole transport layer 300 having a film thickness of 150 nm and composed of triphenyl-diamine (TPD), and formed on the layer are a red EL luminescent layer 301R and composed of a tris (8-hydroxyquinoline) aluminum (Alq3) having a film thickness of 30 nm and doped with DCJTB and rubrene, and an electron hole transport layer (not shown) having a film thickness of 30 nm and composed of Alq3.

Formed above the electron hole transport layer through LiF having a film thickness of 0.8 nm are 2-9-dimethyl-4, 7diphenyl-1, 10-phenanthroline (BCP) having a film thickness of 7 nm and ITO having a film thickness of 77 nm to constitute a transparent cathode electrode 302.

Electron holes injected from the anode electrode 13 and electrons injected from the cathode electrode 302 make radiational reunion in the red EL luminescent layer 301R to cause emission.

Light generated is emitted toward the transparent cathode electrode.

Arranged in adjacent pixels are blue dots and green dots, on which a blue EL luminescent layer 301B and a green EL luminescent layer 301G are formed in place of a red EL luminescent layer.

The blue EL luminescent layer is DPVBi doped with BCzVBi having a film thickness of 15 nm, and the green EL luminescent layer is Alq3 doped with coumarin 540 having a film thickness of 30 nm.

FIG. 15 is a graph indicating the relationship between the number N of parallel EL drive TFTs and dispersion (MAX−MIN)/(MAX+MIN) in luminance among pixels.

As seen from the graph in FIG. 15, dispersion in luminance in the case of N=3 can be reduced to about a half of that in the case of N=1.

Theoretically, it is presumed that with respect to the parallel number N, the degree of dispersion is decreased inversely proportional to $\sqrt{N}$.

According to the graph in FIG. 15, a dispersion decreasing effect as appropriately presumed theoretically is obtained.

Fifth Embodiment

An entire configuration of the display device according to the invention in a fifth embodiment of the invention will be described below with reference to FIGS. 16 to 18.

Formed on the glass substrate 1 are an active matrix AMX constituted by TFTs, a vertical scanning circuit VDRV and a picture signal circuit HDRV.

The cathode electrode 302 of the EL element OLED is connected to a wiring 401 taken out and formed on the glass substrate 1 through a contact hole in a contact area 400 and then to an external connection terminal PAD.

Also, all anode current feeding wiring electrodes A provided in respective columns in pixels are connected outside pixel regions to the external connection terminal PAD through a taken-out electrode 402.

The embodiment has a feature in that the contact area 400 is arranged between the active matrix AMX and the external connection terminal PAD and the picture signal circuit HDRV is disposed on an opposite side of the active matrix AMX to the external connection terminal PAD.

With such arrangement, the taken-out wiring 401 extending from the external connection terminal PAD to the contact area 400 can be made short, so that voltage drop and power consumption caused by resistance of the taken-out wiring can be minimized.

Since current from the EL elements OLED in all pixels flows through the taken-out wiring of the cathode electrode 302, reduction in resistance of the taken-out wiring is important.

Meanwhile, since current flowing through a power source wiring and ground wiring to the picture signal circuit HDRV is small as compared with current flowing through the EL elements OLED, no significant problem is caused even when such wirings are lengthened more or less.

Figure 17:
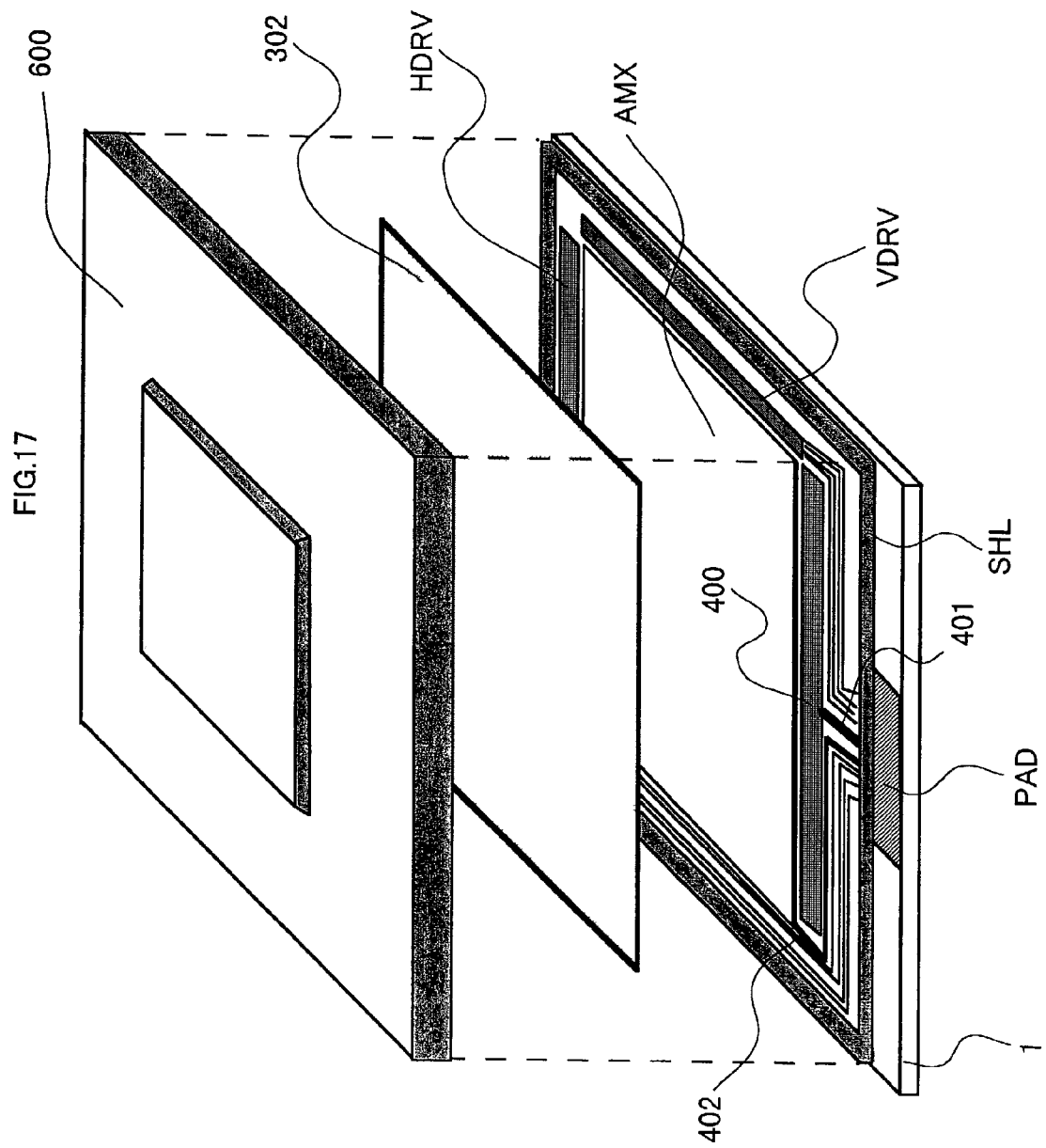
FIG. 17 is an exploded, perspective view showing an entire configuration of display devices according to the respective embodiments of the invention.

FIG. 17 is an exploded, perspective view showing the entire display device shown in FIG. 16.

A seal glass 600 is mounted through a seal SHL on the glass substrate 1, on which the cathode electrode 302 of the EL elements OLED is formed, whereby the EL elements OLED are not exposed to outside air.

Used for the seal SHL is an ultraviolet hardening-type resin, in which fiber glass having a diameter of 10 μm is dispersed.

The seal glass and the glass substrate 1 substantially correspond to each other in external shape at three sides except aside, from which the external connection terminal PAD is taken out, so that the entire panel is made minimum in external dimension.

Figure 18:
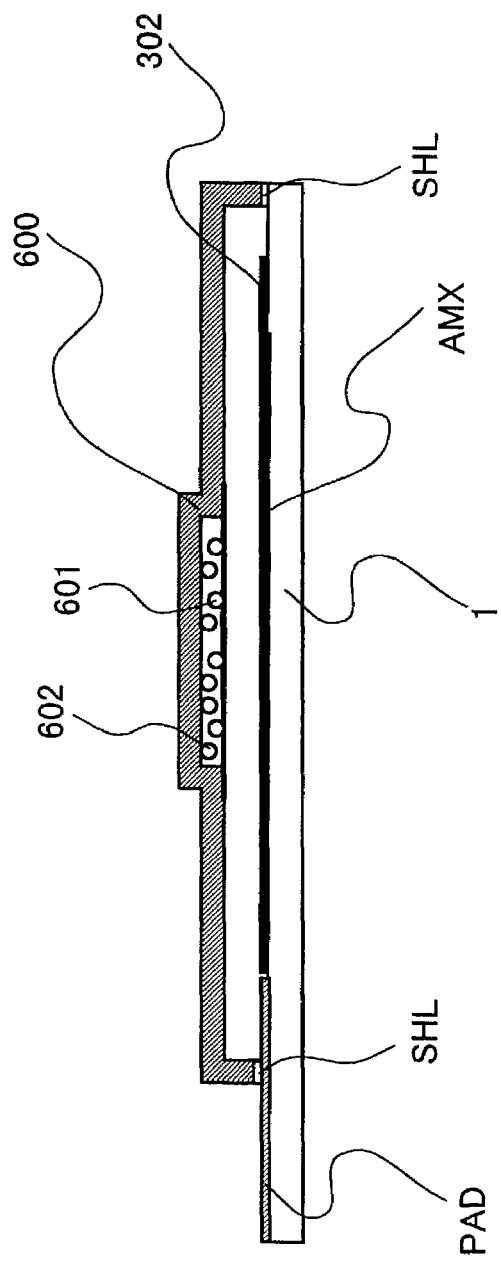
FIG. 18 is a cross sectional view showing an essential part of a cross-sectional structure of display devices according to the respective embodiments of the invention.

FIG. 18 is a cross sectional view showing a cross-sectional structure of the display device shown in FIG. 16.

A chemical adsorbent 602 for absorbing moisture entering from outside and a gas emitted from a material, which forms the EL elements OLED, is held on projections provided in the seal glass 600 by means of a tape 601.

Calcium oxide (CaO) was used as the chemical adsorbent.

Also, a dry N2 gas, from which moisture is removed up to the dew-point of −78° C., is sealed in a cavity in the seal glass 600.

Sixth Embodiment

A manufacturing process, according to a sixth embodiment of the invention, for an active matrix substrate in the display device according to the second embodiment will be described below with reference to FIGS. 19 to 27.

First, the plasma CVD method making use of a mixture gas of $SiH_4$, $NH_3$ and $N_2$ is used to form a $Si_3N_4$ film 200 having a thickness of 50 nm after a non-alkali glass substrate 1 having a thickness of 0.5 mm, a length of 750 mm and a width of 950 mm and a strain temperature of about 670° C. is cleaned.

Subsequently, the plasma CVD method making use of a mixture gas of tetraethoxysilane and $O_2$ is used to form a $SiO_2$ film 2 having a thickness of 120 nm.

In addition, both $Si_3N_4$ and $SiO_2$ are formed at temperature of 400° C.

Then a substantially intrinsic hydro-amorphous silicon film 35 having a thickness of 50 nm is formed on the $SiO_2$ film 2 by the plasma CVD method making use of a mixture gas of $SiH_4$ and Ar.

A deposition temperature was 400° C. and an amount of hydrogen was about 5 atomic % immediately after deposition.

Subsequently, the substrate is annealed at 450° C. for about 30 minutes whereby hydrogen in the hydro-amorphous silicon film 35 is caused to be released.

Subsequently, the plasma CVD method making use of a mixture gas of tetraethoxysilane and $O_2$ is used to form a $SiO_2$ film 201 having a thickness of 100 nm, and then boron (B+) is implanted in a dose $5\times10^{12}$ (atoms/cm$^2$) at acceleration voltage of 40 KeV by ion-implantation.

Figure 19:
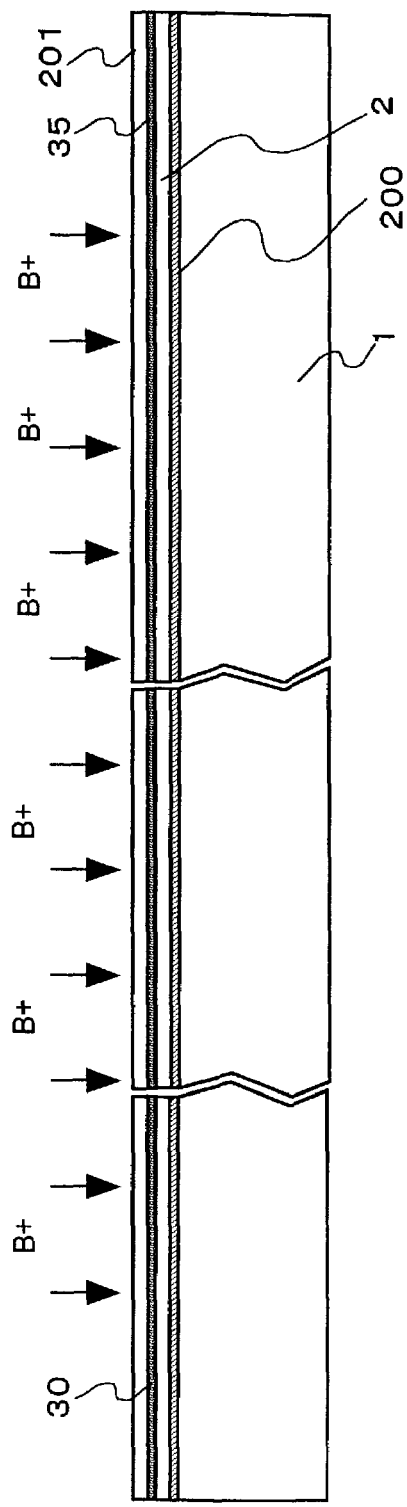
FIG. 19 is a view illustrating the manufacturing process of the display device according to the second embodiment of the invention.

Boron serves to adjust a threshold voltage of TFT (see FIG. 19).

Figure 20:
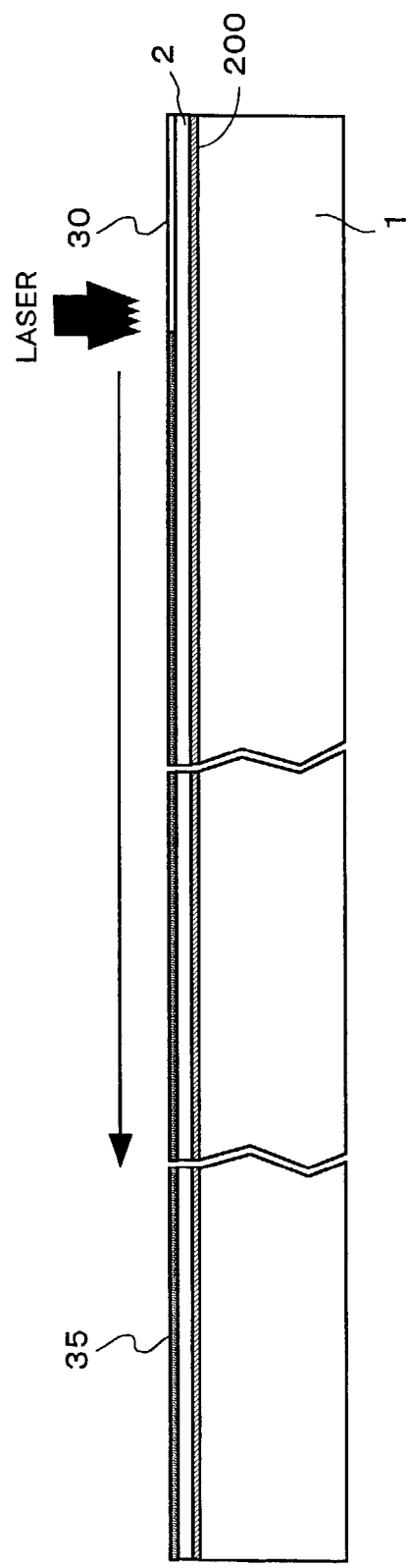
FIG. 20 is a view illustrating the manufacturing process of the display device according to the second embodiment of the invention.

Subsequently, the $SiO_2$ film 201 is removed by a buffer hydrofluoric acid, and pulse excimer laser of a wavelength of 308 nm processed in the form of stripe having a short side of 0.3 mm and a long side of 300 mm is irradiated on the amorphous silicon film 35 at a fluence of 450 mJ/cm$^2$ while moving at 10 μm in a direction along the short side, whereby the amorphous silicon film 35 is melted and recrystallized to provide a P type polycrystal silicon film 30 (see FIG. 20).

At this time, dispersion in the TFT characteristics caused by dispersion in crystal quality of the polycrystal silicon in a scanning direction of laser beam generally tends to become greater than dispersion in a direction perpendicular to the scanning direction of laser beam.

Therefore, a great effect is obtained by arranging a plurality of EL drive TFTs in parallel in the scanning direction of laser beam.

The scanning direction of laser beam shown by arrows in FIGS. 3 or 6 indicates this, and the plurality of EL drive TFTs are arranged substantially in parallel in the scanning direction of laser beam.

The same is with the embodiment shown in FIGS. 10 and 12.

Subsequently, the reactive ion etching method making use of $CF_4$ is used to process the P type polycrystal silicon film 30 in a predetermined form to obtain TFTs and a wiring pattern (P type polycrystal silicon film 30) except the TFTs.

Subsequently, the plasma CVD method making use of a mixture gas of tetraethoxysilane and $O_2$ is used to form $SiO_2$ having a thickness of 100 nm to form a gate insulating film 20.

Subsequently, after the sputtering method is used to form a Mo film having a thickness of 200 nm, an ordinary photolithography method is used to form a predetermined resist pattern PR on the Mo film, and the reactive ion etching method making use of $CF_4$ is used to process the Mo film in a predetermined form to obtain gate electrodes 10N for N type TFTs.

Subsequently, while the resist pattern PR used in etching is left, phosphorus (P) ions are implanted in a dose $10^{15}$ (atoms/cm$^2$) at acceleration voltage of 60 KeV by ion-implantation to form regions of source electrodes and drain electrodes for N type TFTs (see rightward and central portions in FIG. 21).

Figure 21:
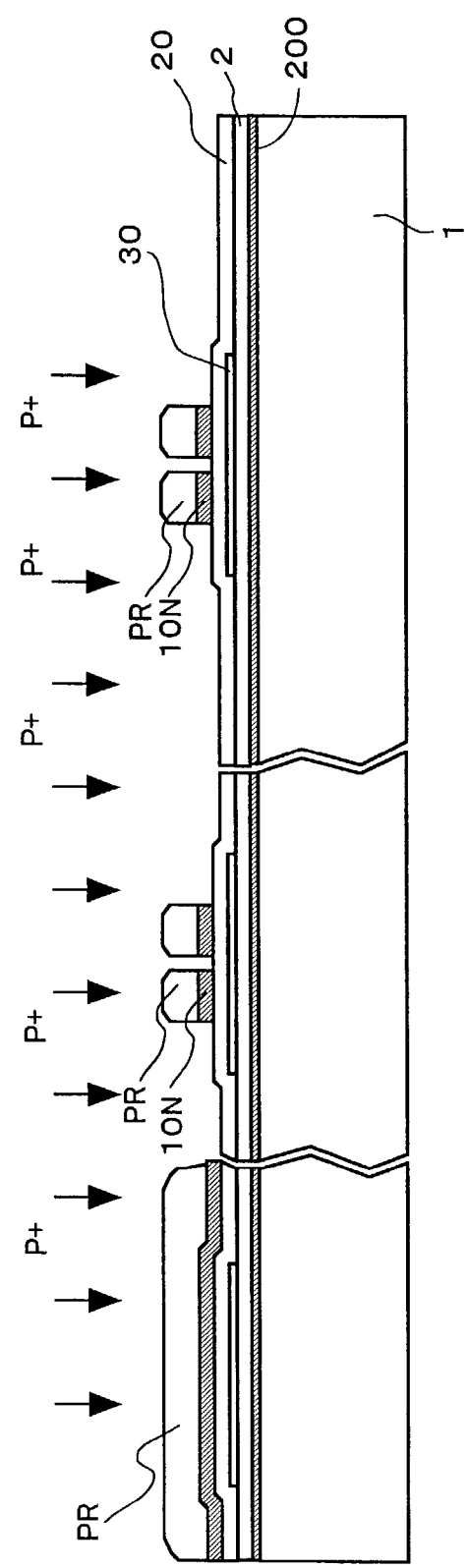
FIG. 21 is a view illustrating the manufacturing process of the display device according to the second embodiment of the invention.

At this time, all the elements are protected by patterns of the Mo film and the photoresist film PR to prevent phosphorus ions from being implanted into the P type TFTs (see a leftward portion in FIG. 21).

Subsequently, while the resist pattern is left, the substrate is processed by a mixed acid and the Mo electrodes thus processed are subjected to side etching whereby the pattern is slimmed and the resist is removed, after which P ions are implanted in a dose $2\times10^{13}$ (atoms/cm$^2$) at acceleration voltage of 65 KeV by ion-implantation to form LDD regions for N type TFTs.

The LDD regions are controlled in length by a side etching time with the mixed acid (see FIG. 22).

Subsequently, a predetermined resist pattern is formed on the Mo film, and the reactive ion etching method making use of $CF_4$ is used to obtain gate electrodes 10P for P type TFTs and a wiring pattern (gate wiring electrode 14) except the TFTs.

Using the gate electrodes 10P for P type TFTs as a mask, boron ions are implanted in a dose $10^{15}$ (atoms/cm$^2$) at acceleration voltage of 40 KeV by ion-implantation to form regions of source electrodes and drain electrodes for P type TFTs.

At this time, all N type TFTs are protected by the photoresist pattern PR to be protected from the etching gas and prevent boron ions from being implanted thereinto (see FIG. 23).

Figure 24:
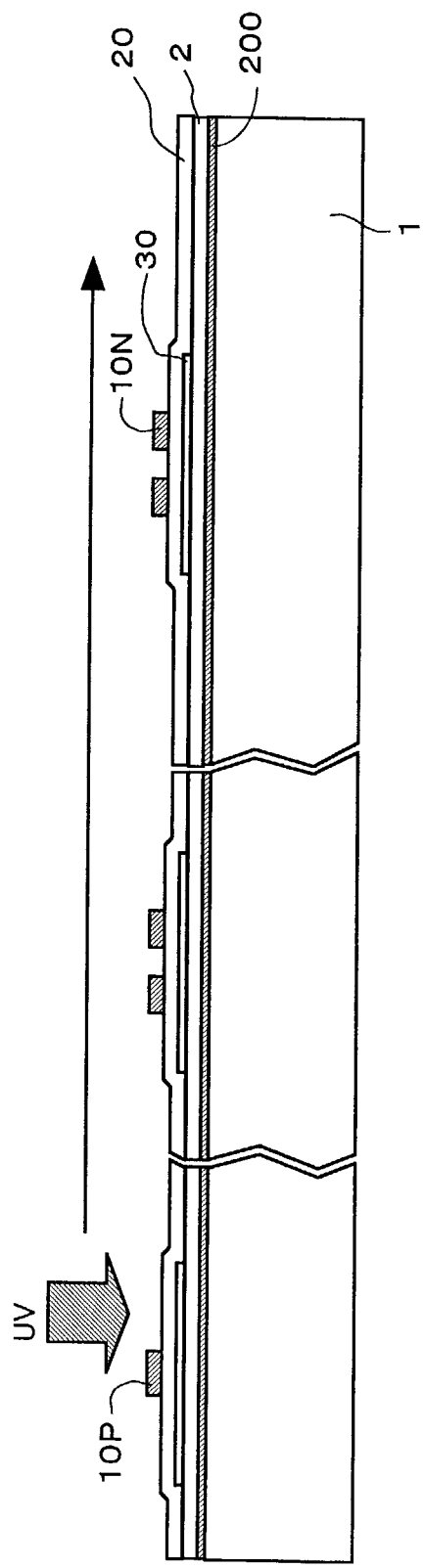
FIG. 24 is a view illustrating the manufacturing process of the display device according to the second embodiment of the invention.

After the photoresist is removed, ultraviolet light from an excimer lamp or metal halide lamp is irradiated to activate impurities implanted by the rapid thermal anneal (RTA) method (see FIG. 24).

Subsequently, the plasma CVD method making use of a mixture gas of tetraethoxysilane and oxygen is used to form $SiO_2$ having a film thickness of 500 nm to form an interlayer insulating film 21.

After a predetermined resist pattern is formed, the wet etching method making use of a mixed acid is used to form contact through holes in the interlayer insulating film 21.

Figure 25:
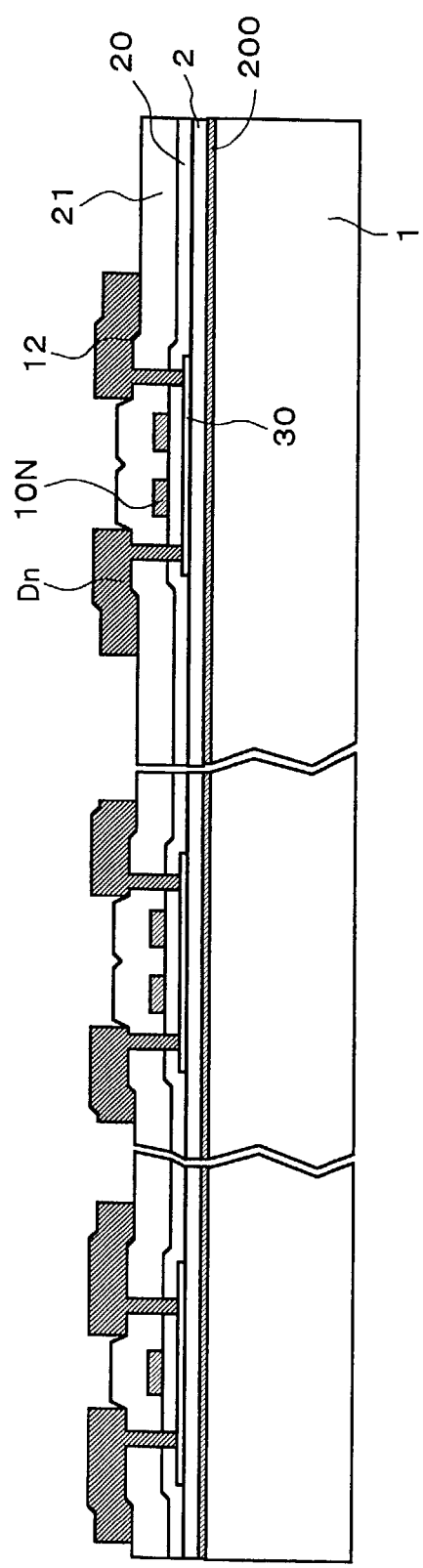
FIG. 25 is a view illustrating the manufacturing process of the display device according to the second embodiment of the invention.

Subsequently, after the sputtering method is used to sequentially laminate Mo film of 50 nm, an Al—Nd alloy of 500 nm and Mo of 50 nm, a predetermined resist pattern is formed, and then the reactive ion etching method making use of a mixed gas of $BCl_3$ and $Cl_2$ performs etching collectively to fabricate picture signal wiring electrodes D, anode current feeding wiring electrodes A, connection wiring electrodes 12 and EL connection wiring electrodes 15 (see FIG. 25).

Subsequently, the plasma CVD method making use of a mixture gas of $SiH_4$, $NH_3$ and $N_2$ is used to form a $Si_3N_4$ film having a thickness of 400 nm to make the same a protective insulating film 22.

After a predetermined photoresist pattern is formed, the dry etching method making use of $SF_6$ is used to form contact through holes in the protective insulating film 22.

Succeedingly, the sputtering method is used to form an ITO film of 70 nm and the wet etching method making use of a mixed acid is used to process the film in a predetermined shape to form anode electrode 13 for EL elements OLED (see FIG. 26).

Finally, the spin coating method is used to coat a photosensitive polyimide resin in a film thickness of about 3.5 μm, and a predetermined mask is used to perform exposure and development to remove the polyimide resin in those portions of the anode electrode, on which EL elements OLED are formed, thereafter performing baking the polyimide resin for 30 minutes at 350° C. to form an organic insulating film 23 having a film thickness of 2.3 μm (see FIG. 27).

The organic insulating film 23 is formed to cover ends of the anode electrode 13 to prevent the EL elements OLED from being broken by field concentration at ends of the ITO electrodes when a very thin organic film forming the EL elements OLED is formed on the anode electrode.

A process of forming EL elements on an active matrix substrate fabricated by the above processes will be described below.

The active matrix substrate is set in a vacuum deposition device, and first introduced into a preheating chamber to be baked under vacuum for one hour at 200° C., whereby moisture adsorbing to surfaces of the substrate and moisture contained in the organic insulating film 23 are removed.

Subsequently, ultraviolet light is irradiated at the intensity of 60 mW/cm$^2$ for 60 seconds in an atmosphere containing oxygen to remove organic substances on the surfaces of the anode electrode.

Subsequently, the active matrix substrate is moved into a pretreatment chamber to be subjected to $O_2$ plasma processing whereby the surfaces of the anode electrode are adjusted in work function.

The processing condition involves 60 seconds at the RF power of 200 W.

This processing adjusts the work function of ITOs being the anode electrode 13 at 5.1 to 5.2 eV, and decreases a barrier level when electrons are injected into an electron hole transport material, whereby an efficiency of injection can be enhanced.

Subsequently, the active matrix substrate is moved into a first deposition chamber to be subjected to mask deposition with a mask, in which an electron hole transport layer is formed on an entire display surface.

Triphenyldiamine (TPD) is used for a material of the electron hole transport layer.

Besides this, for example, α-NPD can be used.

The electron hole transport layer has a film thickness of 150 nm.

Subsequently, the active matrix substrate is moved into a second deposition chamber to be subjected to mask deposition of luminescent materials for respective RGBs.

In deposition of different luminescent materials, predetermined materials are formed in dot positions of respective RGBs by first making register between dots representative of blue color and openings in a deposition mask, forming a blue material, shifting the deposition mask a pitch of one dot within the deposition chamber, making deposition of a green material, and further moving the deposition mask similarly to make deposition of a red material.

Subsequently, the active matrix substrate is moved into a third deposition chamber to form a cathode electrode 302.

In order to enhance an efficiency of electron injection for the organic layer, the cathode electrode 302 is formed such that after LiF is formed to have a film thickness of around 0.8 nm, Al is formed to have a thickness of 150 nm.

Subsequently, the active matrix substrate is moved into a seal chamber, a seal glass having been beforehand baked like the active matrix substrate for dehydration is bonded to the active matrix substrate with an ultraviolet hardening-type resin therebetween, and ultraviolet light is irradiated on a back surface of the active matrix substrate to cure the resin. At this time, a chemical adsorbent is inserted into an air gap in the seal glass.

All the preceding steps after setting of the active matrix substrate must be effected in a state, in which the active matrix substrate is not exposed to the atmospheric air.

Finally, the active matrix substrate, to which the seal glass is bonded, is taken out to be cut into a predetermined size, and driver LSIs are loaded on the substrate to finish a panel.

While the invention having been thought of by the inventors of this application has been concretely described on the basis of the embodiments, it is not limited to the embodiments but can be of course modified within a scope not departing from the gist thereof.

Effects obtained by typical configurations of the invention disclosed in this application are simply described below.

(1) It is possible in a self-luminescence display device according to the invention to obtain a uniform display screen free of unevenness.

(2) It is possible in a self-luminescence display device according to the invention to reduce voltage drop and power consumption caused by resistance of the taken-out wiring of the cathode electrodes.

What is claimed is:

1. A display device comprising a first substrate and a second substrate, wherein at least one of the first substrate and the second substrate is mounted on another substrate through a seal, the first substrate comprising:

a plurality of pixels, a current feeding wiring electrode, a take-out wiring, and an externally connection terminal, each pixel comprising a current drive type luminescent element and a plurality of active elements provided inside the seal on the first substrate, the current drive type luminescent element comprising an anode electrode, an organic electroluminescent layer, and a cathode electrode disposed in this order on the first substrate, wherein the current feeding wiring electrode is electrically connected to the anode electrode, wherein the externally connected terminal is provided outside the seal along the one side of the first substrate, wherein the take-out wiring is electrically connected between the externally connected terminal and the current feeding wiring electrode, and wherein a contact portion between the take-out wiring and the current feeding wiring electrode is arranged inside the seal.

2. A display device according to claim 1, wherein the seal is an ultraviolet hardening-type resin, and wherein a glass fiber is dispersed into the resin.

3. A display device according to claim 1, wherein the first substrate comprises a wiring electrically connected between the externally connected terminal and the cathode electrode, a contact portion between the wiring and the cathode electrode being arranged inside the seal.

4. A display device according to claim 1, wherein the first substrate comprises a driver circuit for driving the plurality of the active elements, wherein the driver circuit is arranged inside the seal along an other side of the first substrate.

5. A display device according to claim 1, wherein at least one portion of the current feeding wiring electrode is composed of Mo/Al/Mo, and at least one portion of the cathode electrode is composed of ITO.

6. A display device according to claim 5, wherein the first substrate comprises a driver circuit for driving the plurality of the active elements, and a picture signal wiring electrode connected between the driver circuit and the active elements, wherein at least one portion of the picture signal wiring electrode is composed of Mo/Al/Mo.

7. A display device according to claim 1, wherein the current feeding wiring electrode is arranged along a side of an area of all pixels.

* * * * *